(12) United States Patent
Carter et al.

(10) Patent No.: US 7,316,603 B2
(45) Date of Patent: Jan. 8, 2008

(54) COMPOSITIONS AND METHODS FOR TANTALUM CMP

(75) Inventors: Phillip W. Carter, Naperville, IL (US); Jian Zhang, Aurora, IL (US); Steven K. Grumbine, Aurora, IL (US); Francesco De Rege Thesauro, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 11/235,765

(22) Filed: Sep. 26, 2005

(65) Prior Publication Data
US 2006/0030158 A1    Feb. 9, 2006

Related U.S. Application Data

(63) Continuation-in-part of application No. 10/376,172, filed on Feb. 27, 2003, now Pat. No. 7,097,541, which is a continuation-in-part of application No. 10/054,059, filed on Jan. 22, 2002, now Pat. No. 6,527,622.

(51) Int. Cl.
C09K 3/14 (2006.01)
C09K 13/06 (2006.01)
B24B 1/00 (2006.01)

(52) U.S. Cl. .................... 451/56; 451/36; 51/302; 438/692; 252/79.4

(58) Field of Classification Search ............... 451/41, 451/36, 60, 56; 438/691–693; 257/E21.304; 252/79.1, 79.2, 79.4; 51/302, 303
See application file for complete search history.

(56) References Cited

U.S. PATENT DOCUMENTS 5,044,128 A    9/1991    Nakano
5,489,233 A    2/1996    Cook et al.
5,527,423 A    6/1996    Neville et al.
5,626,715 A    5/1997    Rostoker (Continued)

FOREIGN PATENT DOCUMENTS

JP    1-270512 A    10/1989

(Continued)

OTHER PUBLICATIONS

Fultz, et al. "Mediator Compounds for The Electrochemcial Study of Biological Redox Systems: A Compilation" Analytica Chim. Acta, vol. 140, pp. 1-18 (1982).

*Primary Examiner*—Hadi Shakeri
(74) *Attorney, Agent, or Firm*—Thomas E. Omholt; Robert J. Ross

(57) ABSTRACT

A composition suitable for tantalum chemical-mechanical polishing (CMP) comprises an abrasive, an organic oxidizer, and a liquid carrier therefor. The organic oxidizer has a standard redox potential ($E^0$) of not more than about 0.5 V relative to a standard hydrogen electrode. The oxidized form comprises at least one pi-conjugated ring, which includes at least one heteroatom directly attached to the ring. The heteroatom can be a N, O, S or a combination thereof. In a method embodiment, a CMP composition comprising an abrasive, and organic oxidizer having an $E^0$ of not more than about 0.7 V relative to a standard hydrogen electrode, and a liquid carrier therefor, is utilized to polish a tantalum-containing surface of a substrate, by abrading the surface of the substrate with the composition, preferably with the aid of a polishing pad.

39 Claims, 4 Drawing Sheets

U.S. PATENT DOCUMENTS

| | | |
|---|---|---|
| 5,691,219 A | 11/1997 | Kawakubo et al. |
| 5,693,239 A | 12/1997 | Wang et al. |
| 5,709,588 A | 1/1998 | Muroyama |
| 5,868,604 A | 2/1999 | Atsugi et al. |
| 5,958,288 A | 9/1999 | Mueller et al. |
| 5,958,794 A | 9/1999 | Bruxvoort et al. |
| 6,063,306 A | 5/2000 | Kaufman et al. |
| 6,093,649 A | 7/2000 | Roberts et al. |
| 6,126,853 A | 10/2000 | Kauffman et al. |
| 6,146,244 A | 11/2000 | Atsugi et al. |
| 6,274,063 B1 | 8/2001 | Li et al. |
| 6,290,736 B1 | 9/2001 | Evans |
| 6,293,848 B1 | 9/2001 | Fang et al. |
| 6,312,321 B1 | 11/2001 | Fukishima et al. |
| 6,569,215 B2 | 5/2003 | Miyata |
| 6,623,355 B2 | 9/2003 | McClain et al. |
| 6,705,926 B2 * | 3/2004 | Zhou et al. .................. 451/41 |
| 6,722,942 B1 * | 4/2004 | Lansford et al. ............... 451/5 |
| 2001/0027798 A1 * | 10/2001 | Flierl et al. .................... 451/60 |
| 2001/0049913 A1 | 12/2001 | Miyata |
| 2002/0039839 A1 | 4/2002 | Thomas et al. |
| 2003/0006369 A1 | 1/2003 | Wang et al. |
| 2003/0181142 A1 | 9/2003 | DeRege Thesauro |
| 2004/0267018 A1 | 12/2004 | Elliot et al. |
| 2005/0070211 A1 * | 3/2005 | Bian .......................... 451/36 |
| 2005/0148179 A1 * | 7/2005 | Hirai et al. ................. 438/689 |
| 2006/0019201 A1 * | 1/2006 | Muramatsu et al. ........ 430/311 |

FOREIGN PATENT DOCUMENTS

| | | |
|---|---|---|
| JP | 11-121411 A | 4/1999 |
| WO | WO 00/77107 A1 | 12/2000 |
| WO | WO 01/44396 A1 | 6/2001 |
| WO | WO 2004/044075 | 5/2004 |
| WO | WO 2004/069947 | 8/2004 |

\* cited by examiner

1,2-Naphthoquinone-4-sulfonic acid, sodium salt

Indigo-1,5-disulfonic acid, disodium salt

2,6-Dichloroindophenol, sodium salt 2,5-Dihydroxybenzoquinone

US 7,316,603 B2

COMPOSITIONS AND METHODS FOR TANTALUM CMP

CROSS-REFERENCE TO RELATED PATENT APPLICATIONS

This patent application is a continuation-in-part of U.S. patent application Ser. No. 10/376,172, filed Feb. 27, 2003 now U.S. Pat. No 7,097,541, which is a continuation-in-part of U.S. patent application Ser. No. 10/054,059, filed Jan. 22, 2002, now U.S. Pat. No. 6,527,622, the disclosures of which are incorporated herein by reference.

FIELD OF THE INVENTION

This invention relates to compositions and methods for polishing a substrate comprising a tantalum-containing surface. More particularly, this application relates to chemical-mechanical polishing compositions containing an organic oxidant capable of selectively oxidizing tantalum in the presence of copper.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates, and their use in the chemical-mechanical polishing of semiconductor surfaces can result in poor surface quality. Because the performance of a semiconductor wafer is directly associated with the planarity of its surface, it is crucial to use a polishing composition and method that results in a high polishing efficiency, uniformity, and removal rate and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

Various metals, metal oxides, metal nitrides, metal alloys, and the like have been used to form electrical connections between interconnection levels and devices, including titanium, titanium nitride, aluminum-copper, aluminum-silicon, copper, tungsten, platinum, platinum-tungsten, platinum-tin, ruthenium, tantalum, tantalum nitride, and combinations thereof. Noble metals present a particular challenge in that they are mechanically hard and chemically resistant, making them difficult to remove efficiently through chemical-mechanical polishing.

The following patents disclose polishing compositions for noble metals. U.S. Pat. No. 5,691,219 discloses a semiconductor memory device comprising a noble metal conductive layer and a polishing composition comprising a halo-compound for polishing the noble metal. U.S. Pat. No. 6,274,063 discloses polishing compositions for nickel substrates comprising a chemical etchant (e.g., aluminum nitrate), abrasive particles, and an oxidizer. U.S. Pat. No. 6,290,736 discloses a chemically active polishing composition for noble metals comprising an abrasive and a halogen in basic aqueous solution. JP 63096599 A2 discloses a method of dissolving metallic ruthenium. JP 11121411 A2 discloses a polishing composition for platinum group metals (e.g., Ru, Pt) comprising fine particles of an oxide of the platinum group metal. JP 1270512 A2 discloses a dissolving solution for noble metals comprising hydrogen peroxide, alkali cyanide, and phosphate ion and/or borate ion. WO 00/77107 A1 discloses a polishing composition for noble metals (e.g., Ru, Rh, Pd, Os, Ir, Pt) comprising abrasive, a liquid carrier, an oxidizer, and a polishing additive including EDTA, nitrogen-containing macrocycles (e.g., tetraazacyclotetradecanes), crown ethers, halides, cyanides, citric acid, phosphines, and phosphonates. WO 01/44396 A1 discloses a polishing composition for noble metals comprising sulfur-containing compounds, abrasive particles, and water-soluble organic additives which purportedly improve the dispersion of the abrasive particles and enhance metal removal rates and selectivity.

In addition, chemical-mechanical polishing of tantalum-containing surfaces, such as tantalum removal in barrier film applications, typically utilize an oxidizing agent. Hydrogen peroxide is by far the most common oxidizing agent used in tantalum CMP. Hydrogen peroxide is a strong oxidizing agent that can react with other slurry components limiting pot-life stability of the polishing slurry composition. Electron transfer catalysts such as Fe, Os, or Ru can be added at low pH to act cooperatively with hydrogen peroxide to accelerate oxidation and removal of the metals present on the surface being polished. At elevated pH values, these metal electron transfer catalysts precipitate as oxide and hydroxide compounds, and lose their effectiveness as electron transfer catalysts. It is often also desirable to selectively oxidize tantalum in the presence of copper. Many common oxidizing agents are not selective between tantalum and copper.

The introduction of porous low-k materials in microchip devices has made "low down-pressure" (low-P) planarization an extremely important factor. Although low-P operation is difficult to incorporate in the currently available framework of CMP, it is possible to combine electrochemically controlled material removal with low-P mechanical polishing where the main role of the latter step is to provide uniform planarization across the sample surface (that is, to facilitate selective material removal from protrusions over recess regions of the surface). This approach, introduced by Applied Materials for industrial applications, is referred to as electrochemical mechanical planarization (ECMP), and can potentially lead to a more efficient planarization technology than the currently practiced chemical mechanical planarization (CMP).

In most applications of ECMP, the mechanical abrasion step involves removal of thin passive films of oxides and/or surface complexes (not of the underlying bulk metal), and hence can be performed at a low down pressure (<1 psi). Electrochemical techniques are often used only as a "probe" of CMP mechanisms to analyze corrosion/erosion behaviors of various CMP systems, but these techniques are not frequently applied to the actual CMP process. In ECMP, electrochemical techniques can be used to both activate and understand the mechanism(s) of material removal. In addition to its low-P processing capability, another major feature of ECMP is that it can be performed using electrolytes with no or very low concentrations of abrasive particles. This helps to eliminate several disadvantages of CMP that are associated with the use of slurries containing high concentrations of abrasive particles, such as lack of within-wafer uniformity, particle coagulation, slurry-handling and waste disposal. The task of endpoint detection is relatively straightforward in ECMP where simply controlling the applied voltage or current can accurately control the extent of planarization. Often it might also be possible to eliminate the need for certain expensive, unstable and/or side-reacting chemicals (oxidizers, surfactants, etc.) in ECMP.

A need remains, however, for polishing systems and polishing methods that will exhibit desirable planarization efficiency, uniformity, and removal rate during the polishing and planarization of substrates, while minimizing defectivity, such as surface imperfections and damage to underlying structures and topography during polishing and planarization. Improved polishing compositions and methods are needed for the polishing of tantalum-containing substrates, particularly compositions and methods that can selectively oxidize tantalum in the presence of copper during chemical-mechanical polishing (CMP).

The present invention provides such improved chemical-mechanical polishing compositions and methods. These and other advantages of the invention will be apparent from the description of the invention provided herein.

BRIEF SUMMARY OF THE INVENTION

The invention provides a composition suitable for tantalum CMP comprising an abrasive, an organic oxidizer, and a liquid carrier for the abrasive and the organic oxidizer. The organic oxidizer has a standard redox potential ($E^0$) of not more than about 0.5 V relative to a standard hydrogen electrode. The oxidizer comprises at least one pi-conjugated ring that includes at least one heteroatom directly attached to the ring. The heteroatom can be N, O, S, or a combination thereof. Preferably, the organic oxidizer is capable of selectively oxidizing tantalum in the presence of copper.

A method of polishing a tantalum-containing substrate comprises abrading a surface of a substrate with a CMP composition of the invention comprising an abrasive, an organic oxidizer having a standard redox potential ($E^0$) of not more than about 0.7 V relative to a standard hydrogen electrode, and a liquid carrier for the abrasive and the organic oxidizer, as described above. In a preferred embodiment, the organic oxidizer has an $E^0$ of not more than about 0.5 V relative to a standard hydrogen electrode. Typically, the substrate is abraded by contacting the CMP composition with the surface of the substrate to be polished utilizing a polishing pad.

DETAILED DESCRIPTION OF THE INVENTION

Figure 1:
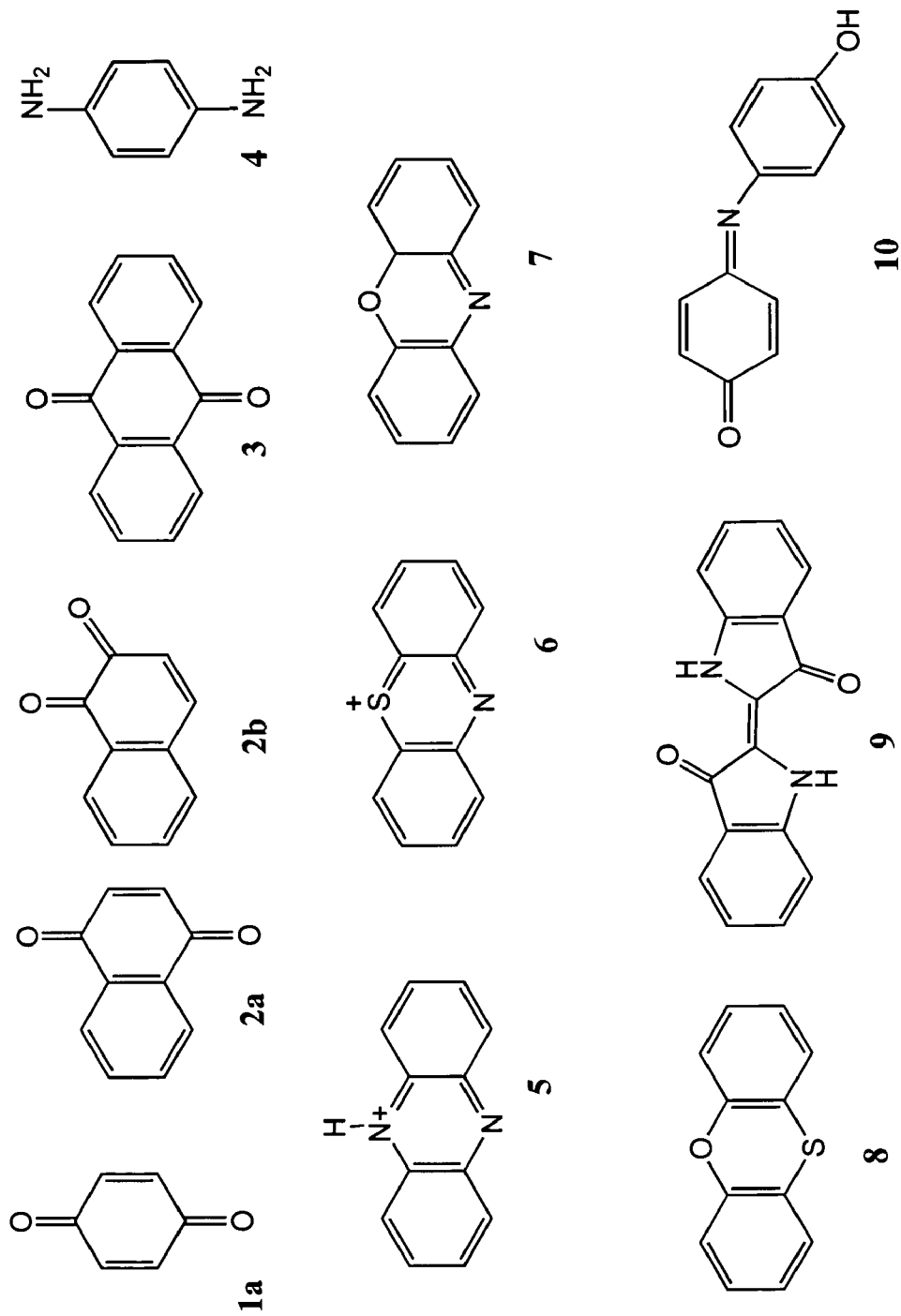
FIG. 1 depicts the chemical structures of a number of classes of organic oxidizers useful in the tantalum CMP compositions of the invention.

The present invention is directed to compositions and methods for polishing a substrate comprising a noble metal and/or tantalum. The substrate is contacted with a chemical-mechanical polishing ("CMP") system comprising (a) an abrasive and polishing pad, (b) a liquid carrier, and at least one polishing additive (i.e., one or more polishing additives). The polishing additive can be any suitable compound that desirably increases the rate at which the system polishes at least one noble metal layer of the substrate. At least a portion of the substrate is abraded so as to polish the surface of the substrate. The abrasive, the liquid carrier, and optional polishing additive(s), as well as any other components suspended in the liquid carrier, form the polishing composition of the CMP system.

For polishing substrates having a tantalum-containing surface, the polishing additive is preferably an organic oxidant having a standard redox potential ($E^0$) of not more than about 0.5 V relative to a standard hydrogen electrode. The organic oxidizer comprises at least one pi-conjugated ring that includes at least one heteroatom directly attached to the ring. The at least one heteroatom is selected from the group consisting of N, O, S and a combination thereof. Preferably, the organic oxidizer is capable of selectively oxidizing tantalum in the presence of copper.

The abrasive can be fixed on the polishing pad and/or can be in particulate form and suspended in the liquid carrier. Preferably the abrasive is suspended in a liquid carrier. The polishing pad can be any suitable polishing pad.

The abrasive can be any suitable abrasive, many of which are known in the art. For example, the abrasive can be natural or synthetic and can comprise diamond (e.g., polycrystalline diamond), garnet, glass, carborundum, metal oxide, nitride, carbide, polymer, composite (e.g., polymer composite or polymer/metal oxide composite), and the like. The choice of abrasive can depend on the particular nature of the substrate being polished. The abrasive preferably comprises metal oxide, diamond, silicon carbide, silicon nitride, boron nitride, or combinations thereof. The metal oxide desirably is selected from the group consisting of alumina, silica, titania, ceria, zirconia, germania, magnesia, co-formed products thereof, and combinations thereof. More preferably, the abrasive comprises silica, alumina (e.g., α-alumina, fumed alumina), silicon nitride, and/or silicon carbide. In some embodiments, the abrasive preferably comprises α-alumina having a mean particle size of about 150 nm or greater (e.g., about 200 nm or greater, or about 250 nm or greater). Typically, the α-alumina is used in combination with a softer abrasive (e.g., fumed alumina).

The abrasive can have any suitable particle size. In some embodiments, the use of α-alumina having a mean particle size of about 150 nm or greater (e.g., about 200 nm or greater, or about 250 nm or greater) is preferred. The mean particle size is reported as determined by light scattering, for example, using a Horiba LA-910 instrument.

Any abrasive material, as described herein, can be utilized in the tantalum CMP compositions of the invention. Non-limiting examples of preferred abrasives include a silica abrasive, an alumina abrasive, a zirconia abrasive, a ceria abrasive, and any combination thereof. For polishing a tantalum-containing surface, a preferred abrasive is colloidal silica. The colloidal silica can be doped with a metal, such as aluminum or boron, if desired. Preferably, the mean particle size of the colloidal silica is about 120 nm or less, more preferably about 70 nm or less.

Any suitable amount of abrasive can be present in the polishing composition. Typically, about 0.01 percent by weight or more (e.g., about 0.03 percent by weight or more, or about 0.05 percent by weight or more) abrasive will be present in the polishing composition. More typically, about 0.1 percent by weight or more abrasive will be present in the polishing composition. The amount of abrasive in the polishing composition typically will not exceed about 50 percent by weight, more typically will not exceed about 20 percent by weight. Preferably, the amount of abrasive in the polishing composition is about 0.5 percent by weight to about 10 percent by weight. In some embodiments, the amount of abrasive in the polishing composition desirably is about 0.1 percent by weight to about 5 percent by weight. In the case of tantalum CMP compositions, the abrasive preferably is suspended in the liquid carrier at a total solids content in the range of about 0.01 to about 5 percent by weight, more preferably about 0.05 to about 2 percent by weight, most preferably about 0.1 to about 1 percent by weight.

A liquid carrier is used to facilitate the application of the abrasive (when present), one or more polishing additives, and any optional additives to the surface of a suitable substrate to be polished or planarized. The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

In a first embodiment of the invention, a polishing additive is present in the chemical mechanical polishing system. The polishing additive interacts with a noble metal surface and promotes its dissolution during chemical-mechanical polishing. Suitable polishing additives include diketones, diketonates, urea compounds, heterocyclic nitrogen-containing compounds, heterocyclic oxygen-containing compounds, heterocyclic phosphorus-containing compounds, nitrogen-containing compounds that can be zwitterionic compounds, sulfonic acid compounds, salts thereof, and combinations thereof.

Suitable diketones and diketonates include, for example, cyclopentanediones, cyclohexanediones, cyclobutanediones, cycloheptanediones, linear diketones, and alkylammonium-2,4-pentanedionate salts. Suitable heterocyclic nitrogen-containing compounds include, for example, pyridines, bipyridines, quinolines, phenanthrolines, pyrimidines, hydropyrimidines, pyrazines, pyrazoles, imidazoles, imidazolines, imidazolidines, piperazines, triazines, purines, oxazoles, oxazines, pyrroles, pyrrolines, pyrrolidines, indoles, indolines, isoindoles, carbazoles, and combinations thereof. Suitable heterocyclic oxygen-containing compounds include, for example, dioxolanes, trioxolanes, furans, pyrones, morpholines, coumarins, benzopyrones, dioxanes, trioxanes, and ozonides. Suitable heterocyclic phosphorus-containing compounds include, for example, phospholes, phospholanes, phospholenes, and phospholidines. The heterocyclic nitrogen-, oxygen-, and phosphorus-containing compounds may further comprise one or more alcohol, amide, ketone, carboxylic acid, or sulfonic acid groups. For example, the heterocyclic nitrogen-containing polishing additives can be picolinic acid, 2-pyridinecarboxaldehyde, 3-pyridinecarboxaldehyde, 4-pyridinecarboxaldehyde, 2-pyridinemethanol, 2,3-pyridinedicarboxylic acid, 2,6-pyridinedicarboxylic acid, 2-pyridylacetic acid HCl, 3-pyridylacetic acid HCl, 2-pyridineethanesulfonic acid, 4-pyridineethanesulfonic acid, 1-(3-sulfopropyl)pyridinium hydroxide, adenine, guanine, cytosine, and thymine.

The nitrogen-containing compounds that can be zwitterionic compounds are nitrogen-containing compounds that can be zwitterionic compounds at a particular pH. Zwitterionic compounds are neutral compounds having formal opposite charges on non-adjacent atoms. Zwitterionic compounds typically contain both an acid moiety and a base moiety, with the pKa of the acid moiety differing from the pKa of the base moiety, such that the compound is zwitterionic when the pH is between the pKa of the acid moiety and the pKa of the base moiety. Zwitterionic compounds also are referred to as inner salts. For example, amino acids are nitrogen-containing compounds that can be zwitterionic compounds, though the nitrogen-containing compounds that can be zwitterionic compounds need not be amino acids. In that respect, as regards the polishing additives identified above, pyridineethanesulfonic acids, pyridine sulfonic acids, pyridyl acetic acids, 3-(3-pyridyl)proprionic acid, pyrazine carboxylic acid, 1-(3-sulfopropyl)pyridinium hydroxide, and picolinic acid are nitrogen-containing compounds that can be zwitterionic compounds. Additional nitrogen-containing compounds that can be zwitterionic compounds, which are useful in the polishing composition of the invention, include sulfanilic acid, dodecyldimethyl(3-sulfopropyl)ammonium hydroxide (lauryl sulfobetaine), (carboxymethyl)trimethylammonium hydroxide (betaine), 2-(N-morpholino)ethanesulfonic acid, N-2-acetamidoiminodiacetic acid, 1,3-bis[tris(hydroxymethyl)methylamino]propane, N-2-acetamido-2-aminoethanesulfonic acid, 3-(N-morpholine)propanesulfonic acid, N-tris(hydroxymethyl)methyl-2-aminoethanesulfonic acid, N-2-hydroxyethylpiperazine-N'-2-ethanesulfonic acid, N-2-hydroxyethylpiperazine-N'-3-propanesulfonic acid, N-tris(hydroxymethyl)methylglycine, cyclohexylaminoethanesulfonic acid, 3-(cyclohexylamino)propanesulfonic acid, 2-acrylamido-2-methylpropanesulfonic acid, salts thereof, and combinations thereof.

The sulfonic acid compound is a mono-, di-, tri-, or poly-sulfonic acid compound or a salt thereof. Preferably, the sulfonic acid compound is a mono-, di-, or tri-sulfonic acid compound or a salt thereof. Typically, the sulfonic acid compound is selected from the group consisting of an aryl sulfonic acid, an alkylsulfonic acid, a heterocyclic sulfonic acid, or a salt thereof. Suitable sulfonic acid compounds include any of the sulfonic acid compounds described above, for example, pyridineethanesulfonic acids, pyridine sulfonic acids, 1-(3-sulfopropyl)pyridinium hydroxide, sulfanilic acid, dodecyldimethyl(3-sulfopropyl)ammonium hydroxide, 2-(N-morpholino)ethanesulfonic acid, N-2-acetamido-2-aminoethanesulfonic acid, 3-(N-morpholine)propanesulfonic acid, N-tris(hydroxymethyl)methyl-2-aminoethanesulfonic acid, N-2-hydroxyethylpiperazine-N'-2-ethanesulfonic acid, N-2-hydroxyethylpiperazine-N'-3-propanesulfonic acid, cyclohexylaminoethanesulfonic acid, 3-(cyclohexylamino)propanesulfonic acid, and 2-acrylamido-2-methylpropanesulfonic acid. In addition, the sulfonic acid compound can be selected from the group consisting of benzenesulfonic acid, hydroquinonesulfonic acid, isethionic acid, 4,7-diphenyl-1,10-phenanthrolinedisulfonic acid, 1,2-naphthoquinone-4-sulfonic acid, aminoanthraquinone sulfonic acid, 2-formylbenzenesulfonic acid, 3-amino-4-hydroxybenzenesulfonic acid, 4-hydroxybenzenesulfonic acid, 6-aminotoluene-3-sulfonic acid, benzidine-3-sulfonic acid, diphenylamine4-sulfonic acid, hydroxylamine-O-sulfonic acid, piperidine sulfonic acid, p-anisidine-3-sulfonic acid, p-xylene-2-sulfonic acid, methanesulfonic acid, 3-cyclohexylamino-1-propanesulfonic acid, 5-formyl-2-furanesulfonic acid, salts thereof, and combinations thereof.

Preferably, the polishing additive is selected from the group consisting of picolinic acid, 2-pyridinecarboxaldehyde, 2-pyridinemethanol, 2,3-pyridinedicarboxylic acid, 2,6-pyridinedicarboxylic acid, 2-pyridylacetic acid HCl, 2-pyridineethanesulfonic acid, 4-pyridineethanesulfonic acid, 1,10-phenanthroline, 1,2-pentadione, sulfanilic acid, pyridinesulfonic acid, 1-(3-sulfopropyl)pyridinium hydroxide, hydroquinonesulfonic acid, N-tris(hydroxymethyl)methyl-2-aminoethanesulfonic acid, benzenesulfonic acid, isethionic acid, salts thereof, and combinations thereof.

When the polishing additive is a sulfonic acid compound, desirably the abrasive comprises alumina, particularly α-alumina. Preferably, the abrasive comprises a mixture of α-alumina and fumed alumina (e.g., about 60% α-alumina and about 40% fumed alumina). More preferably, the abrasive comprises α-alumina having a mean particle size of about 150 nm or greater (e.g., about 200 nm or greater, or about 250 nm or greater).

The CMP system can comprise any suitable amount of polishing additive(s) of the first embodiment and typically comprises about 0.01 percent by weight or more of such polishing additive(s). Preferably, the CMP system comprises about 0.01 percent by weight to about 10 percent by weight (e.g., about 0.1 percent by weight to about 10 percent by weight) of such polishing additive(s). More preferably, the CMP system comprises 0.1 percent by weight to about 5 percent by weight (e.g., about 0.1 percent by weight to about 2 percent by weight) of such polishing additive(s).

In a second embodiment of the invention, a polishing additive and a peroxy-type oxidizer are present in the chemical mechanical polishing system. The polishing additive is a metal compound having two or more oxidation states. The polishing additive can be a metal salt or a metal ligand complex. For example, the polishing additive can be an iron, copper, or manganese compound of formula MX, $MX_2$, $MX_3$, or $M_2X_3$ where M is Fe, Cu, or Mn, and X is selected from the group consisting of nitrate, fluoride, chloride, bromide, iodide, oxide, hydroxide, sulfate, acetate, oxalate, acetylacetonate, citrate, tartrate, malonate, gluconate, phthalate, succinate, perchlorate, perbromate, periodate, and combinations thereof. The polishing additive also can be a cerium compound of formula $CeX_2$ where X is selected from oxide, hydroxide, and combinations thereof. Preferably, the polishing additive is iron sulfate, iron nitrate, copper nitrate, or manganese perchlorate. The CMP system may contain one or more polishing additives and may contain mixtures of the polishing additives described above.

The CMP system can comprise any suitable amount of polishing additive(s) of the second embodiment and typically comprises about 0.0001 percent by weight or more of such polishing additive(s). Preferably, the CMP system comprises about 0.001 percent by weight to about 5 percent by weight of such polishing additive(s). More preferably, the CMP system comprises 0.001 percent by weight to about 2 percent by weight of such polishing additive(s).

In a third embodiment, an abrasive is present in the chemical-mechanical polishing system and is suspended in the liquid carrier. The abrasive mixture comprises α-alumina and fumed alumina. Typically, the weight ratio of α-alumina to fumed alumina is about 0.6:1 to about 9:1. Preferably, the weight ratio of α-alumina to fumed alumina is about 1:1 to about 4:1 (e.g., about 1.5:1 to about 3:1).

The CMP system of the third embodiment optionally further comprises a polishing additive. The polishing additive can be any suitable polishing additive. For example, the polishing additive can be any of the polishing additives discussed above with respect to the first and second embodiments. Suitable polishing additives further include carboxylates and acids thereof, hydroxylates and acids thereof, carbonylates and acids thereof, pyrophosphates, condensed phosphates, phosphonic acids and salts thereof, amines, amino alcohols, amides, imines, imino acids and salts thereof, nitriles, nitros, thiols, thioesters, thioethers, carbothiolic acids and salts thereof, carbothionic acids and salts thereof, thiocarboxylic acids and salts thereof, sulfonic acids and salts thereof, thiosalicylic acids and salts thereof, and mixtures thereof.

The CMP systems optionally further comprise a per-type oxidizer. The CMP system of the second embodiment comprises a peroxy-type oxidizer. The per-type oxidizer can be any suitable per-type oxidizer. Suitable per-type oxidizers include inorganic and organic per-compounds. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The per-type oxidizer preferably is selected from the group consisting of hydrogen peroxide, persulfate salts (e.g., ammonium persulfate), periodate salts, and permanganate salts. More preferably, the per-type oxidizer is ammonium persulfate or hydrogen peroxide.

The peroxy-type oxidizer is a compound containing at least one peroxy group and is selected from the group consisting of organic peroxides, inorganic peroxides, and mixtures thereof. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Preferably, the peroxy-type oxidizer is hydrogen peroxide.

The CMP systems can contain any suitable amount of per-type or peroxy-type oxidizer. The CMP system preferably comprises about 0.5 to about 20 percent by weight per-type oxidizer with the polishing additive(s) of the first embodiment. The CMP system preferably comprises about 0.1 percent by weight to about 20 percent by weight (e.g., about 1 percent by weight to about 10 percent by weight) peroxy-type oxidizer with the polishing additive(s) of the second embodiment. The CMP system preferably comprises about 0.5 to about 20 percent by weight per-type oxidizer with the abrasive of the third embodiment.

A fourth embodiment of the present invention comprises a CMP composition suitable for use in polishing a tantalum-containing surface of a substrate, particularly a tantalum and copper-containing surface. The CMP composition comprises: (a) an abrasive; (b) an organic oxidizer having a standard redox potential ($E^0$) of not more than about 0.5 V relative to a standard hydrogen electrode (SHE), and (c) a liquid carrier therefor. The organic oxidizer comprises at least one pi-conjugated ring having at least one heteroatom directly attached to the ring. The heteroatom can be N, O, S or a combination thereof. In some preferred embodiments, the organic oxidizer is capable of selectively oxidizing tantalum in the presence of copper.

Preferably, the organic oxidizer comprises an unsaturated hydrocarbon ring, an unsaturated heterocyclic ring, or a combination thereof. In some preferred embodiments the organic oxidizer includes a heterocyclic ring comprising 2 or more heteroatoms (e.g., N, O, S, or a combination thereof). In other preferred embodiments, the pi-conjugated ring of the organic oxidizer includes at least three heteroatoms (e.g., N, O. S., or a combination thereof).

Non-limiting examples of organic oxidizers suitable for use in the compositions and/or methods of the present invention include, a compound having at least one quinone moiety (e.g., an anthraquinone, a naphthoquinone, a benzoquinone, and the like), a paraphenylenediamine compound, a phenazine compound, a thionine compound, a phenoxazine compound, phenoxathiin compound, an indigo compound, an indophenol compound, or any combination thereof. Structures of un-substituted forms of the foregoing suitable organic oxidizers are shown in FIG. 1, in which Compound 1 is 1,4-benzoquinone, Compound 2a is 1,4-naphthoquinone, Compound 2b is 1,2-naphthoquinone, Compound 3 is 9,10-anthraquinone, Compound 4 is paraphenylenediamine, Compound 5 is phenazine, Compound 6 is thionine, Compound 7 is phenoxazine, Compound 8 is phenoxathiin, Compound 9 is indigo, and Compound 10 is indophenol. Suitable organic oxidizers of the foregoing chemical classes have an $E^0$ of about 0.5 V or less, relative to SHE.

One preferred class of organic oxidizers includes at least one acidic substituent or a salt thereof bound to the oxidizer molecule. Suitable acidic substituents include a carboxylic acid substituent, a sulfonic acid substituent, a phosphonic acid substituent, a salt thereof, or any combination thereof.

Another preferred class of organic oxidizers include a positively-charged group (i.e., a cationic oxidizer), such as a positively charged heterocyclic group, a quaternary ammonium substituent or an amine substituent. When the positively charged group is an amine substituent, the pH of the composition is selected so that the pH is at least about 1 unit lower than the pKa of the amino substituent, in order to ensure that the amine substituent is protonated, thus imparting a positive charge to the substituent. Non-limiting examples of positively charged organic oxidizers include thionine compounds, phenazine compounds, salts thereof, and the like. Suitable salts of cationic oxidizers include, without limitation, halide salts (e.g., chloride, bromide, and iodide), sulfate salts, phosphate salts, sulfonate salts, phosphonate salts, nitrate salts, acetate salts, benzoate salts, and the like.

In some preferred embodiments, the organic oxidizer is capable of undergoing a reversible redox reaction as characterized by a cyclic voltamogram in which an anodic reaction and a cathodic reaction are both observable during a plurality of repeated cycles of reduction and oxidation.

Preferably, the organic oxidizer is soluble in the liquid carrier, or at least dispersible or emulsifiable in the liquid carrier (e.g., with the aid of a suitable surfactant, dispersant, or emulsifier). The organic oxidizer preferably is present in (i.e., dissolved in dispersed in, or emulsified in) the liquid carrier at a concentration of organic oxidizer in the range of about 0.1 to about 10 millimolar.

Figure 2:
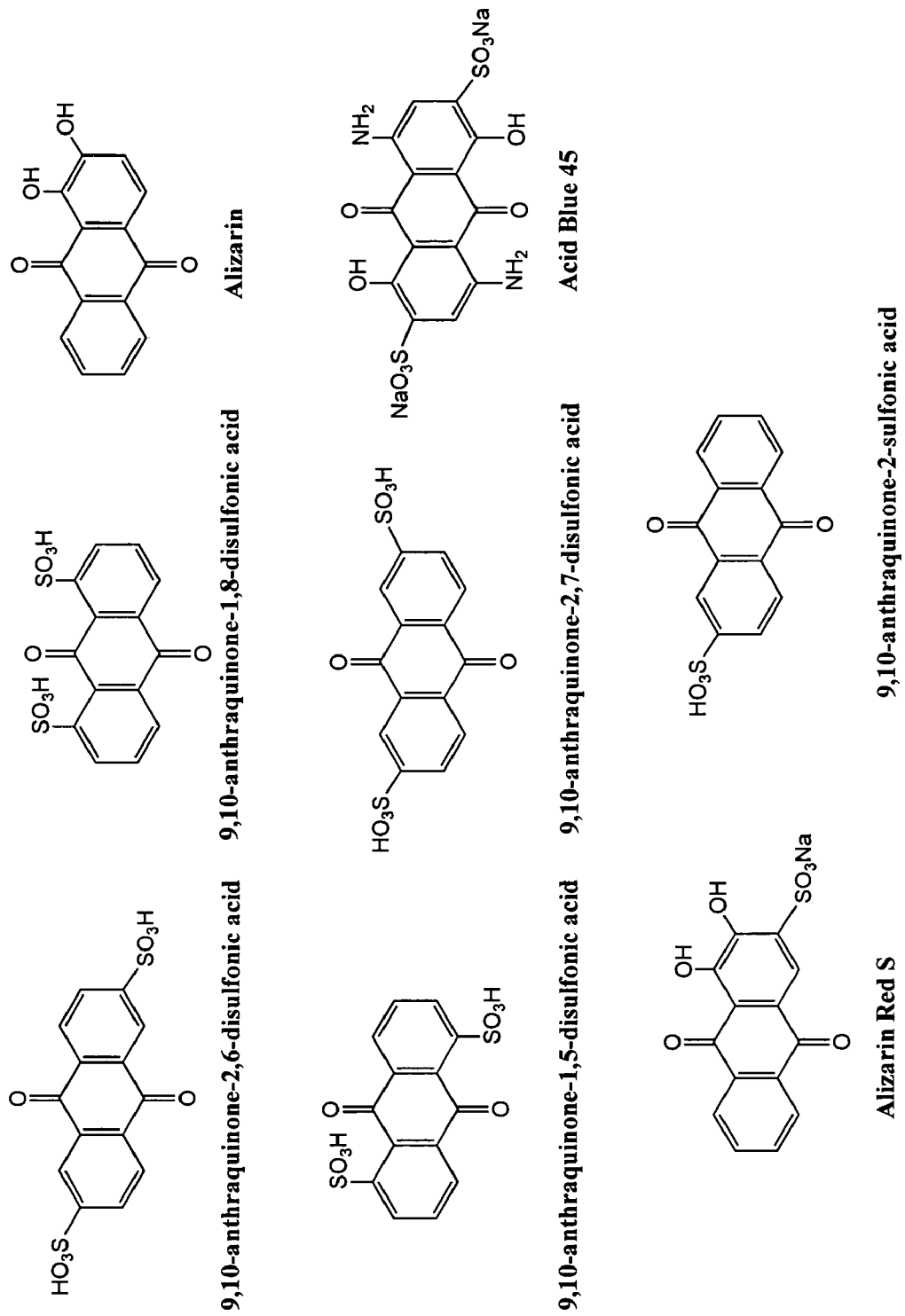
FIG. 2 depicts the chemical structures of some preferred anthraquinone organic oxidizers.

A preferred tantalum CMP composition includes an organic oxidizer comprising at least one quinone compound, such as an anthraquinone, a naphthoquinone, a benzoquinone, or any combination thereof. Preferred anthraquinone compounds include, without limitation, 9,10-anthraquinone-2,6-disulfonic acid, 9,10-anthraquinone-2,7-disulfonic acid, 9,10-anthraquinone-2-sulfonic acid, 9,10-anthraquinone-1,8-disulfonic acid, 9,10-anthraquinone-1,5-disulfonic acid, Alizarin, Alizarin Red S, Acid Blue 45, salts thereof, and any combination thereof; the structures of which shown in FIG. 2. Preferred benzoquinone compounds include 2,5-dihydroxy-1,4-benzoquinone or a salt thereof.

Figure 3:
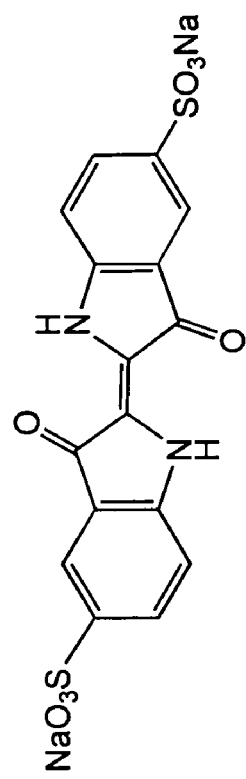
FIG. 3 depicts the chemical structure of a preferred indigo compound organic oxidizer.

Another preferred tantalum CMP composition includes an organic oxidizer that is an indigo compound. Preferred indigo compounds include, without limitation, indigo-5,5'-disulfonic acid or a salt thereof, the structure of which is shown in FIG. 3.

In one preferred embodiment, the organic oxidizer is the sole oxidizer present in the tantalum CMP composition. In other preferred embodiments the tantalum CMP compositions of the invention further comprise an auxiliary oxidizing agent, preferably in a molar ratio of auxiliary oxidizing agent to organic oxidizer of about 1:10 to about 10:1. Examples of suitable auxiliary oxidizing agents include a per-type or peroxy-type oxidizer, or a combination thereof, as described herein. Non-limiting examples of suitable auxiliary oxidizing agents include, an iodate compound (e.g., potassium iodate, sodium iodate, and the like), a persulfate compound (e.g., potassium persulfate, sodium persulfate, and the like), and hydrogen peroxide. In addition, presence of as little as one tenth the concentration of organic oxidizer (9,10-anthraquinone-2,6-disulfonic acid, 0.5 millimolar) compared to potassium iodate concentration (5 millimolar), led to a significant increase in pot life compared to slurries containing potassium iodate alone.

Any liquid carrier suitable for use in CMP processing can be utilized in the tantalum CMP compositions of the present invention. The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

In some preferred embodiments, the tantalum CMP compositions of the invention further comprise an excipient such as an alkali metal salt, a surfactant, a chelating agent, and the like, to aid in removal of oxidized tantalum species (e.g., tantalum oxide) from the surface of the wafer during the polishing process.

In still other preferred embodiments, the CMP compositions of the invention include a copper oxidation inhibiting agent. Non-limiting examples of copper oxidation inhibiting agents include triazole and its derivatives, such as 1,2,4 triazole, 1H-1,2,3 triazole, s-triazine, 1H-1,2,4-triazole-3-thiol, 1,2,4-triazolo[1,5-a]pyrimidine, 1H-1,2,3-triazolo[4,5-b]pyridine, 1,2,3-triazole-4,5-dicarboxylic acid; benzotriazole and its derivatives, such as 1H-benzotriazole, 1H-benzotriazole-1-carboxaldehyde, benzotriazole-5-carboxylic acid, 5-methyl-1 H-benzotriazole, 5-chlorobenzotriazole, 1-(isocyanomethyl)-1H-benzoriazole; and the like.

A method for polishing a tantalum-containing surface of a substrate comprises abrading a surface of a substrate with a tantalum CMP composition comprising an organic oxidizer and a liquid carrier therefor. Optionally, an abrasive material (e.g., colloidal silica, fumed silica, fumed alumina, α-alumina, and the like) can be included in the CMP composition. Preferably, the surface to be polished comprises, at least in part, tantalum, tantalum nitride, or a combination thereof. In addition, preferably, at least part of surface to be polished comprises copper. In a preferred tantalum CMP method embodiment, the organic oxidizer has an $E^0$ of not more than about 0.7 V, relative to SHE. The organic oxidizer comprises at least one pi-conjugated ring having at least one heteroatom directly attached to the ring. The heteroatom can be N, O, S or a combination thereof. In another preferred embodiment, the organic oxidizer has an $E^0$ of not more than about 0.5 V relative to SHE.

Preferably, the substrate to be polished (e.g., a semiconductor wafer) is mounted on the platen of a CMP apparatus and the CMP composition is supplied to the surface of the substrate to be polished. A polishing pad is then utilized to abrade the surface of the wafer, aided by the CMP composition. The pad can be any conventional polishing pad, including, without limitation, a foamed or solid polymer pad (e.g., a polyurethane pad), a pad including imbedded abrasive particles (i.e., a fixed abrasive pad), and the like, as described herein and as is well known in the CMP art. Additionally, the methods of the present invention encompass electrochemical CMP processes in which an electric potential is applied to the surface to be polished, to electrochemically dissolve metals from the surface of the substrate with the aid of the pad and CMP composition.

Figure 4:
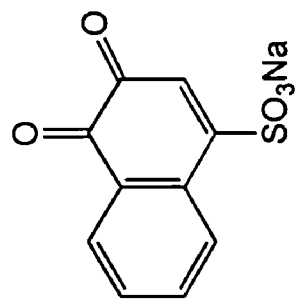
FIG. 4 depicts the chemical structure of a preferred naphthoquinone organic oxidizer.
Figure 5:
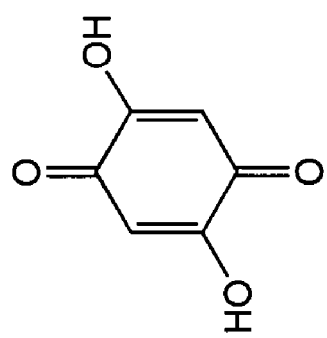
FIG. 5 depicts the chemical structure of a preferred benzoquinone organic oxidizer.

In some preferred method embodiments of the present invention, the organic oxidizer comprises a quinone compound, such as an anthraquinone, a naphthoquinone, a benzoquinone, or a combination thereof. Non-limiting examples of suitable anthraquinone compounds include the compounds shown in FIG. 2. Examples of suitable naphthoquinone compounds include, without limitation, 1,2-naphthoquinone-4-sulfonic acid and salts thereof, the structure of which is shown in FIG. 4. Preferred benzoquinone compounds include, without limitation, 2,5-dihydroxy-1,4-benzoquinone (DHBQ), the structure of which is shown in FIG. 5, or a salt thereof.

Figure 6:
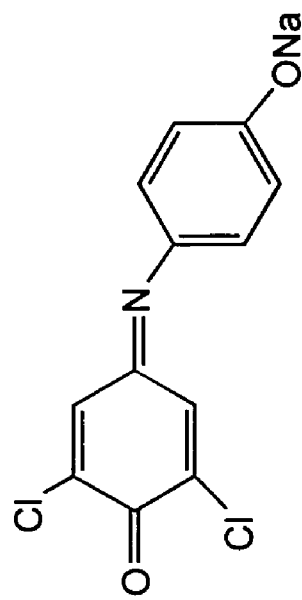
FIG. 6 depicts the chemical structure of a preferred indophenol organic oxidizer.

Yet another preferred tantalum CMP method employs an organic oxidizer comprising at least one indophenol compound. Preferred indophenol compounds include, without limitation, 2,6-dichloroindophenol and salts thereof (e.g., the sodium salt), the structure of which is shown in FIG. 6.

The CMP systems and compositions of any of the above embodiments desirably have a pH of about 2 to about 12. The actual pH range will depend at least upon the type of substrate being polished. When the CMP system is used to polish a platinum-containing substrate, the pH is desirably about 2 to about 7. When the CMP system is to polish a ruthenium-containing substrate, the pH is desirably about 5 or more, preferably about 7 to about 11. When the CMP system is used to polish an iridium-containing substrate, the pH is desirably about 5 to about 12, preferably about 7 to about 9. While the use of a higher pH tends to increase the removal rate of the noble metal, the removal rate of silicon dioxide layers similarly increases resulting in an overall decrease in the polishing selectivity. When the CMP composition is used to polish a tantalum-containing surface, the pH is preferably in the range of about 1.5 to about 5.

The CMP systems of any of the above embodiments optionally further comprise an amine-containing monomeric, oligomeric, or polymeric compound, which helps to reduce the removal rate of a silicon dioxide layer. Suitable amine-containing compounds include polyethylenimine, dimethylaminopropylamine, 1,4-bis(3-aminopropyl)piperazine, and the like.

The CMP systems of any of the above embodiments desirably are used in a method of polishing a substrate comprising at least one noble metal and/or tantalum containing layer and optionally an insulating layer, whereby the substrate is contacted with the chemical-mechanical polishing system and at least a portion of the metal layer or insulating layer (if present) of the substrate is abraded such that the metal layer or insulating layer becomes polished. The substrate can be any suitable substrate (e.g., integrated circuit, memory or rigid disk, metal, ILD layer, semiconductor, micro-electro-mechanical system, ferroelectric, magnetic head, polymeric film, and low or high dielectric constant film) and can contain any suitable noble metal or noble metal alloy layer (e.g., metal conductive layer). The insulating layer can comprise any suitable insulating material, such as a metal oxide, porous metal oxide, glass, organic polymer, fluorinated organic polymer, or any other suitable high or low-$\eta$ insulating material. The insulating layer preferably comprises a silicon-based metal oxide. The noble metal, noble metal alloy, or noble metal oxide layer preferably comprises platinum (Pt), iridium (Ir), rhenium (Re), ruthenium (Ru), rhodium (Rh), palladium (Pd), silver (Ag), osmium (Os), or gold (Au). Preferably, the noble metal or noble metal alloy layer comprises platinum, ruthenium (e.g., $RuO_2$), or iridium (e.g., $IrO_2$).

The following examples further illustrate the invention but, of course, should not be construed as in any way limiting its scope.

EXAMPLE 1

This example demonstrates the effect of polishing additives on the rate of dissolution of platinum.

The dissolution and corrosion rates of platinum were evaluated electrochemically using a platinum rotating disk electrode (RDE) in the presence of different polishing compositions (Polishing Compositions 1A-1L and 1A'-1L'). The platinum electrode was rotating at 500 rpm and held in contact with an abrasive pad with a down force of about 90 kPa (13 psi). The metal dissolution rate was evaluated as the surface of the electrode was abraded (dissolution rate) and after abrasion (corrosion rate). The platinum activity was measured as a current density and then recalculated into a dissolution rate or corrosion rate (in A/min) using Faraday's law. When hydrogen peroxide is used as the oxidizer, the calculated rates of dissolution and corrosion include an additional current density resulting from the electrochemical activity of hydrogen peroxide at the electrode. Thus, the reported dissolution and corrosion rates for platinum in the presence of hydrogen peroxide may be greater than the true platinum dissolution and corrosion rates.

Each of the polishing compositions contained 6 percent by weight α-alumina and either 1 percent by weight ammonium persulfate (Polishing Compositions 1A-1L) or 1 percent by weight hydrogen peroxide and 0.1 N $K_2SO_4$ supporting electrolyte (Polishing Compositions 1A'-1L'). Polishing Compositions 1A and 1A' (control) contained no polishing additive. Polishing Compositions 1B-1J and 1B'-1J' (comparative) each contained 1 percent by weight of glycine, methionine, histidine, proline, mercaptosuccinic acid, 2-imino-4-thioburet, 2-amino-2-methylpropanol, and KBr, respectively. Polishing Compositions 1K-1L and 1K'-1L' (invention) each contained 1 percent by weight of picolinic acid, 2,5-cyclopentanedione, and pyrazole, respectively. The dissolution and corrosion rates for platinum were measured for each of the chemical-mechanical polishing systems. The rates of dissolution and corrosion for platinum in the presence of ammonium persulfate and hydrogen peroxide are summarized in Tables 1 and 2, respectively.

TABLE 1

Platinum Dissolution and Corrosion Rates with Ammonium Persulfate

| Polishing Composition | Polishing Additive | Oxidizer | pH | Pt Diss. Rate | Pt Corr. Rate |
|---|---|---|---|---|---|
| 1A (control) | none | $(NH_4)_2S_2O_8$ | 4.6 | 16.8 | <0.1 |
| | | | 7.2 | 34.6 | 1.2 |
| | | | 9.0 | 42 | 0.2 |
| 1B (comparative) | glycine | $(NH_4)_2S_2O_8$ | 5.1 | 17.4 | — |
| | | | 7.1 | 37.7 | |
| | | | 8.5 | 34.8 | |
| 1C (comparative) | methionine | $(NH_4)_2S_2O_8$ | 2.1 | 14.5 | 0.1 |
| | | | 6.1 | 14.5 | 0.1 |
| | | | 8.0 | 1.74 | 0.1 |
| 1D (comparative) | histidine | $(NH_4)_2S_2O_8$ | 4.1 | 29 | 0.1 |
| | | | 7.0 | 29 | 0.1 |
| | | | 9 | 34.9 | 0.1 |
| 1E (comparative) | proline | $(NH_4)_2S_2O_8$ | 4.9 | 34.8 | 0.1 |
| | | | 7.4 | 34.8 | 0.3 |
| | | | 8.9 | 58 | 0.1 |
| 1F (comparative) | mercaptosuccinic acid | $(NH_4)_2S_2O_8$ | 2.2 | 29 | — |
| | | | 6.2 | 29 | |
| | | | 8.3 | 29 | |
| 1G (comparative) | 2-imino-4-thioburet | $(NH_4)_2S_2O_8$ | 3.9 | 31.9 | 0.1 |
| | | | 6.1 | 29 | 0.1 |
| | | | 8.5 | 23.2 | 0.1 |
| 1H (comparative) | 2-amino-2-methylpropanol | $(NH_4)_2S_2O_8$ | 3.9 | 31.9 | 0.6 |
| | | | 6.8 | 34.8 | 2.9 |
| | | | 9.6 | 46.4 | 2.9 |
| 1I (comparative) | KBr | $(NH_4)_2S_2O_8$ | 4 | 34.8 | 0.1 |
| | | | 7 | 37.7 | 0.3 |
| | | | 9 | 58 | 0.9 |
| 1J (invention) | picolinic acid | $(NH_4)_2S_2O_8$ | 4.0 | 20.2 | 0.2 |
| | | | 6.9 | 52.2 | 0.9 |
| | | | 9.8 | 55.1 | 0.2 |
| 1K (invention) | 2,5-cyclopentanedione | $(NH_4)_2S_2O_8$ | 3.9 | 22.6 | 1.5 |
| | | | 6.2 | 20.3 | 2 |
| | | | 8.2 | 24.8 | 1.5 |
| 1L (invention) | pyrazole | $(NH_4)_2S_2O_8$ | 5.1 | 21 | 0.1 |
| | | | 7.0 | 26.1 | 0.5 |
| | | | 8.9 | 29 | 0.9 |

TABLE 2

Platinum Dissolution and Corrosion Rates with Hydrogen Peroxide

| Polishing Composition | Polishing Additive | Oxidizer | pH | Pt Diss. Rate | Pt Corr. Rate |
|---|---|---|---|---|---|
| 1A' (control) | none | $H_2O_2$ | 3.6 | 34.8 | 34.8 |
| | | | 6.0 | 5.8 | 0.93 |
| | | | 8.9 | 20.3 | 9.3 |
| 1B' (comparative) | glycine | $H_2O_2$ | 4 | 63.8 | — |
| | | | 6 | 20.3 | |
| | | | 8.5 | 130.5 | |
| 1C' (comparative) | methionine | $H_2O_2$ | 3.8 | 69.6 | — |
| | | | 5.9 | 66.7 | |
| | | | 8.2 | 101.5 | |
| 1D' (comparative) | histidine | $H_2O_2$ | 3.6 | 174 | — |
| | | | 7.9 | 116 | |
| | | | 9.1 | 261 | |
| 1E' (comparative) | proline | $H_2O_2$ | 4.1 | 43.5 | — |
| | | | 6.1 | 14.5 | |
| | | | 9.1 | 29 | |
| 1F' (comparative) | mercaptosuccinic acid | $H_2O_2$ | 2.2 | 174 | — |
| | | | 6.2 | 377 | |
| | | | 8.3 | 290 | |
| 1G' (comparative) | 2-imino-4-thioburet | $H_2O_2$ | 3.8 | 26.1 | 5.2 |
| | | | 6.1 | 29 | 5.8 |
| | | | 8.2 | 34.8 | 10.2 |
| 1H' (comparative) | 2-amino-2-methylpropanol | $H_2O_2$ | 4.0 | 29 | 34.8 |
| | | | 7.5 | 31 | 31.9 |
| | | | 11.2 | 232 | 290 |
| 1I' (comparative) | KBr | $H_2O_2$ | 4.0 | 26.1 | 0.2 |
| | | | 6.1 | 6.1 | 0.3 |
| | | | 9.5 | 37.7 | 0.2 |
| 1J' (invention) | picolinic acid | $H_2O_2$ | 3.8 | 319 | 290 |
| | | | 7.2 | 63.8 | 58 |
| | | | 9.8 | 34.8 | — |
| 1K' (invention) | 2,5-cyclopentanedione | $H_2O_2$ | 5.4 | 20.3 | 1.7 |
| | | | 6.8 | 18.3 | 2.9 |
| | | | 8.7 | 29 | 17.4 |
| 1L' (invention) | pyrazole | $H_2O_2$ | 4.1 | 34.8 | — |
| | | | 6.2 | 26.1 | |
| | | | 8.9 | 26.1 | |

These results demonstrate that high noble metal dissolution rates can be obtained using a chemical-mechanical polishing composition of the invention.

EXAMPLE 2

This example demonstrates the effect of polishing additives on the rate of dissolution of ruthenium.

The dissolution and corrosion rates of ruthenium were evaluated electrochemically using a ruthenium rotating disk electrode (0.32 cm$^2$) in the presence of different polishing compositions (Polishing Compositions 2A-2G and 2A'-2G'). The ruthenium electrode was rotating at 500 rpm and held in contact with an abrasive pad with a down force of about 90 kPa (13 psi). The metal dissolution rate was evaluated as the surface of the electrode was abraded (dissolution rate) and after abrasion (corrosion rate). The ruthenium activity was measured as a current density and then recalculated into a dissolution or corrosion rate (in Å/min) using Faraday's law. When hydrogen peroxide is used as the oxidizer, the calculated rates of dissolution and corrosion include an additional current density resulting from the electrochemical activity of hydrogen peroxide at the electrode. Thus, the reported dissolution and corrosion rates for ruthenium in the presence of hydrogen peroxide may be greater than the true ruthenium dissolution and corrosion rates.

Each of the polishing compositions contained 6 percent by weight α-alumina and either 1 percent by weight ammonium persulfate (Polishing Compositions 2A-2G) or 1 percent by weight hydrogen peroxide and 0.1 N $K_2SO_4$ supporting electrolyte (Polishing Compositions 2A'-2G'). Polishing Compositions 2A and 2A' (control) contained no polishing additive. Polishing Compositions 2B-2E and 2B'-2E' (comparative) each contained 1 percent by weight of glycine, mercaptosuccinic acid, potassium oxalate, and 1-hydroxyethylidene-1,1-diphosphonic acid (i.e., Dequest® 2010 product), respectively. Polishing Compositions 2F-2G and 2F'-2G' (invention) each contained 1 percent by weight of picolinic acid and 2,5-cyclopentanedione, respectively. The dissolution and corrosion rates for ruthenium were measured for each of the chemical-mechanical polishing systems. The rates of dissolution and corrosion for ruthenium in the presence of ammonium persulfate oxidizing agent and hydrogen peroxide are summarized in Tables 3 and 4, respectively.

TABLE 3

Ruthenium Dissolution and Corrosion Rates with Ammonium Persulfate

| Polishing Composition | Polishing Additive | Oxidizer | pH | Ru Diss. Rate | Ru Corr. Rate |
|---|---|---|---|---|---|
| 2A (control) | none | $(NH_4)_2S_2O_8$ | 5.0 | 100 | 2.75 |
|  |  |  | 8.2 | 63 | 2.5 |
| 2B (comparative) | glycine | $(NH_4)_2S_2O_8$ | 5.1 | 145 | 1.1 |
|  |  |  | 8.2 | 250 | 4.5 |
| 2C (comparative) | mercaptosuccinic acid | $(NH_4)_2S_2O_8$ | 5 | 40 | 2.38 |
|  |  |  | 8.4 | 80 | 0.45 |
| 2D (comparative) | potassium oxalate | $(NH_4)_2S_2O_8$ | 5.4 | 95 | 5 |
|  |  |  | 8.2 | 145 | 1.75 |
| 2E (comparative) | 1-hydroxyethylidene-1,1-diphosphonic acid (Dequest® 2010) | $(NH_4)_2S_2O_8$ | 5.0 | 85-125 | 0.3 |
|  |  |  | 8.3 | 250 | 0.83 |
| 2F (invention) | picolinic acid | $(NH_4)_2S_2O_8$ | 4.9 | 110 | 0.75 |
|  |  |  | 8.2 | 250 | 1.2 |
| 2G (invention) | 2,5-cyclopentanedione | $(NH_4)_2S_2O_8$ | 5.2 | 195 | 2.5 |
|  |  |  | 8.1 | 250 | 2.5 |

TABLE 4

Ruthenium Dissolution and Corrosion Rates with Hydrogen Peroxide

| Polishing Composition | Polishing Additive | Oxidizer | pH | Ru Diss. Rate | Ru Corr. Rate |
|---|---|---|---|---|---|
| 2A' (control) | none | $H_2O_2$ | 5.0 | 75 | 9.5 |
|  |  |  | 8.0 | 145 | 10 |
| 2B' (comparative) | glycine | $H_2O_2$ | 6.1 | 250 | 0.5 |
|  |  |  | 8.6 | 1250 | 200 |
| 2C' (comparative) | mercaptosuccinic acid | $H_2O_2$ | 5.0 | 3000 | 127 |
|  |  |  | 8.5 | 825 | 237 |
| 2D' (comparative) | potassium oxalate | $H_2O_2$ | 5.3 | 250 | 250 |
|  |  |  | 8.1 | 300-1250 | 24 |
| 2E' (comparative) | 1-hydroxyethylidene-(1,1-diphosphonic acid (Dequest® 2010) | $H_2O_2$ | 5.4 | 800 | 212 |
|  |  |  | 8.5 | 2500 | 250 |
| 2F' (invention) | picolinic acid | $H_2O_2$ | 5.0 | 2500 | 400 |
|  |  |  | 8.6 | 2250 | 25 |
| 2G' (invention) | 2,5-cyclopentanedione | $H_2O_2$ | 5.2 | 1000 | 3.25 |
|  |  |  | 8.1 | 950-2000 | 25 |

These results demonstrate that high noble metal dissolution rates can be obtained using a chemical-mechanical polishing composition of the invention.

EXAMPLE 3

This example demonstrates the effect of different polishing additives on the rate of dissolution of platinum and ruthenium.

The dissolution and corrosion rates of platinum and ruthenium were evaluated electrochemically using either a platinum or ruthenium rotating disk electrode in the presence of different polishing compositions (Polishing Compositions 3A-3AA). The platinum and ruthenium metal electrodes were rotating at 500 rpm and held in contact with an abrasive pad with a down force of about 90 kPa (13 psi). The platinum and ruthenium dissolution rates were evaluated as the surface of the electrode was abraded (dissolution rate) and after abrasion (corrosion rate). The platinum and ruthenium activity was measured as a current density and then recalculated into a dissolution or corrosion rate (in Å/min) using Faraday's law. When hydrogen peroxide is used as the oxidizer, the calculated rates of dissolution and corrosion include an additional current density resulting from the electrochemical activity of hydrogen peroxide at the electrode. Thus, the reported dissolution and corrosion rates for platinum or ruthenium in the presence of hydrogen peroxide may be greater than the true platinum or ruthenium dissolution and corrosion rates.

The dissolution and corrosion rates for the polishing compositions were evaluated in two groups. The first data set consisted of Polishing Compositions 3A-3Q. The second data set consisted of Polishing Compositions 3R-3AA.

Each of the Polishing Compositions 3A-3Q contained 6 percent by weight α-alumina, 1 percent by weight hydrogen peroxide, and 0.1 N $K_2SO_4$ supporting electrolyte. Polishing Composition 3A (control) comprised no polishing additive. Polishing Compositions 3B-3G (comparative) each contained 1 percent by weight cyclobutane dicarboxylic acid, lactic acid, 1-hydroxyethylidene-1,1-diphosphonic acid (i.e., Dequest® 2010 product), glycine, sucrose, and ethanol, respectively. Polishing Compositions 3H-3Q (invention) each contained 1 percent by weight 3-(3-pyridyl)propionic acid, 2-pyridinemethanol, 2-pyridine carboxaldehyde, 2-pyridinecarboxamide, 2,3-pyridine dicarboxylic acid, 2-pyridylacetic acid HCl, 4-pyridineethanesulfonic acid, 2,5-cyclopentanedione, $FeSO_4$, and $Fe(NO_3)_3$, respectively.

Each of the polishing compositions 3R-3AA contained 6 percent by weight α-alumina, 1 percent by weight hydrogen peroxide, and 0.1 N $K_2SO_4$ supporting electrolyte except for Polishing Compositions 3S and 3W which did not contain any hydrogen peroxide. Polishing Compositions 3R-3AA (invention) each contained 1 percent by weight sulfanilic acid, 2-pyridineethanesulfonic acid (no HPO), 2-pyridineethanesulfonic acid, 2-pyridinesulfonic acid, 3-pyridylacetic acid HCl, 4-pyridylacetic acid HCl (no HPO), 4-pyridylacetic acid HCl, 2-pyrazine carboxylic acid, 1-(3-sulfopropyl)pyridinium hydroxide, and 4-pyridineethanesulfonic acid, respectively.

The dissolution and corrosion rates for platinum and ruthenium were measured for each of the chemical-mechanical polishing systems. The dissolution and corrosion rates for platinum and ruthenium for each of the chemical-mechanical polishing systems are summarized in Tables 5 and 6.

TABLE 5

Platinum and Ruthenium Dissolution and Corrosion Rates

| Polishing Composition | Polishing Additive | pH | Pt Diss. Rate | Pt Corr. Rate | Ru Diss. Rate | Ru Corr. Rate |
|---|---|---|---|---|---|---|
| 3A (control) | none | 5 | 29 | 2.9 | 55 | 10 |
| | | 9.5 | 150 | 35 | 130 | 30 |
| 3B (comparative) | cyclobutane dicarboxylic acid | 5 | 10150 | 3480 | 1550 | 375 |
| | | 9.5 | 64 | 377 | 3000 | 25 |
| 3C (comparative) | lactic acid | 5 | 1160 | 290 | 700 | 400 |
| | | 9.5 | 29 | 9 | 1450 | 6.25 |
| 3D (comparative) | 1-hydroxyethylidene-1,1-diphosphonic acid (Dequest ® 2010) | 5 | 377 | 116 | 1000 | 140 |
| | | 9.5 | 348 | 174 | 2500 | 105 |
| 3E (comparative) | glycine | 5 | 46 | 116 | 50 | 5 |
| | | 9.5 | 93 | 129 | 125 | 125 |
| 3F (comparative) | sucrose | 5 | 29 | 2.9 | 33 | 7.5 |
| | | 9.5 | 116 | 61 | 138 | 40 |
| 3G (comparative) | ethanol | 5 | 93 | 26 | 125 | 35 |
| | | 9.5 | 23 | 20 | 145 | 40 |
| 3H (invention) | 3-(3-pyridyl) propionic acid | 5 | 2175 | 841 | 1250 | 178 |
| | | 9.5 | 377 | 46 | 700 | 73 |
| 3I (invention) | 2-pyridine methanol | 5 | 2900 | 2030 | 1735 | 250 |
| | | 9.5 | 116 | 580 | 750 | 200 |
| 3J (invention) | 2-pyridine carboxaldehyde | 5 | 1421 | 667 | 800 | 120 |
| | | 9.5 | 81 | 24 | 200 | 8 |
| 3K (invention) | 2-pyridine carboxamide | 5 | 32 | 14 | 25 | 5 |
| | | 9.5 | 87 | 35 | 123 | 33 |
| 3L (invention) | 2,3-pyridine dicarboxylic acid | 5 | 3770 | 1769 | 1500 | 325 |
| | | 9.5 | 174 | 67 | 2025 | 113 |
| 3M (invention) | 2-pyridylacetic acid HCl | 5 | 1740 | 580 | 1500 | 200 |
| | | 9.5 | 101 | 90 | 2750 | 55 |
| 3N (invention) | 4-pyridineethane sulfonic acid | 5 | 2900 | 667 | 1675 | 250 |
| | | 9.5 | 116 | 87 | 1625 | 175 |
| 3O (invention) | 2,5-cyclopentanedione | 5 | 46 | 4 | 105 | 15 |
| | | 9.5 | 197 | 102 | 1800 | 800 |
| 3P invention) | $FeSO_4$ | 5 | 232 | 63 | 88 | 50 |
| | | 9.5 | 87 | 35 | 130 | 33 |
| 3Q (invention) | $Fe(NO_3)_3$ | 5 | 52 | 20 | 150 | 15 |
| | | 9.5 | 116 | 58 | 145 | 100 |

TABLE 6

Platinum and Ruthenium Dissolution and Corrosion Rates

| Polishing Composition | Polishing Additive | pH | Pt Diss. Rate | Pt Corr. Rate | Ru Diss. Rate | Ru Corr. Rate |
|---|---|---|---|---|---|---|
| 3R (invention) | sulfanilic acid | 5 | 37 | 22 | 450 | 95 |
| | | 9.5 | 348 | 116 | 450 | 50 |
| 3S (invention) | 2-pyridineethanesulfonic acid (no HPO) | 5 | 12 | 4 | 25 | 1 |
| | | 9.5 | 29 | 5 | 7.5 | 2 |
| 3T (invention) | 2-pyridineethanesulfonic acid | 5 | 1740 | 1247 | 300 | 150 |
| | | 9.5 | 551 | 203 | 250 | 145 |
| 3U (invention) | 2-pyridine sulfonic acid | 5 | 58 | 35 | 250 | 33 |
| | | 9.5 | 667 | 174 | 550 | 40 |
| 3V (invention) | 3-pyridylacetic acid HCl | 5 | 899 | 580 | 950 | 88 |
| | | 9.5 | 319 | 290 | 1025 | 100 |
| 3W (invention) | 4-pyridylacetic acid HCl (no HPO) | 5 | 13 | 4 | 30 | 4.5 |
| | | 9.5 | 19 | 6 | 23 | 0.8 |
| 3X (invention) | 4-pyridylacetic acid HCl | 5 | 928 | 158 | 750 | 158 |
| | | 9.5 | 1450 | 116 | 525 | 175 |
| 3Y (invention) | 2-pyrazine carboxylic acid | 5 | 29 | 8 | 150 | 8 |
| | | 9.5 | 348 | 87 | 500 | 90 |
| 3Z (invention) | 1-(3-sulfopropyl) pyridinium hydroxide | 5 | 29 | 13 | 300 | 2.5 |
| | | 9.5 | 377 | 87 | 375 | 75 |
| 3AA (invention) | 4-pyridineethane sulfonic acid | 5 | 957 | 377 | 925 | 170 |
| | | 9.5 | 928 | 116 | 400 | 78 |

These results demonstrate that high noble metal dissolution rates can be obtained using a chemical-mechanical polishing composition of the invention.

EXAMPLE 4

This example demonstrates the effect of polishing additives on the rate of dissolution of platinum.

The dissolution and corrosion rates of platinum were evaluated electrochemically using a platinum rotating disk electrode in the presence of two different polishing compositions (Polishing Compositions 4A and 4B). The platinum electrode was rotating at 500 rpm and held in contact with an abrasive pad with a down force of about 90 kPa (13 psi). The platinum dissolution rate was evaluated as the surface of the electrode was abraded (dissolution rate) and after abrasion (corrosion rate). The platinum activity was measured as a current density and then recalculated into a dissolution or corrosion rate (in Å/min) using Faraday's law.

Each of the polishing compositions contained 6 percent by weight α-alumina, 1 percent by weight ammonium persulfate, and 1 percent by weight polishing additive. Polishing Composition 4A (comparative) contained 1 percent by weight triethylamine as the polishing additive. Polishing Composition 4B (invention) contained 1 percent by weight 1,10-phenanthroline as the polishing additive. The dissolution and corrosion rates for platinum were measured for each of the chemical-mechanical polishing systems at pH values ranging from 5 to 10. The dissolution and corrosion rates for platinum for each of the chemical-mechanical polishing systems are summarized in Table 7.

TABLE 7

Platinum Dissolution and Corrosion Rates

| Polishing Composition | Oxidizer | Polishing Additive | pH | Pt Diss. Rate | Pt Corr. Rate |
|---|---|---|---|---|---|
| 4A (comparative) | $(NH_4)_2S_2O_8$ | $NEt_3$ | 8.5 | 146 | 4.5 |
| 4B (invention) | $(NH_4)_2S_2O_8$ | 1,10-phenanthroline | 5.8 | 33.6 | 0.01 |
| | | | 7.2 | 53.2 | 0.5 |
| | | | 8.0 | 168 | 1.4 |
| | | | 8.7 | 128 | 1.54 |
| | | | 9.5 | 203 | 1.78 |

These results demonstrate that high noble metal dissolution rates can be obtained using a chemical-mechanical polishing composition of the invention.

EXAMPLE 5

This example compares the effect of polishing compositions comprising heterocyclic nitrogen-containing compounds on the rate of platinum or ruthenium removal.

Similar substrates comprising platinum or ruthenium layers were polished on a tabletop polisher with different polishing compositions (Polishing Compositions 5A-5G). Each of the Polishing Compositions 5A (comparative) and 5B-5G (inventive) contained 8 percent by weight alumina (60% α-alumina/40% fumed alumina), 1 percent by weight hydrogen peroxide, and 1 percent by weight of either cyclobutane dicarboxylic acid, 2-pyridinecarboxaldehyde, 2-pyridinemethanol, 2,3-pyridine dicarboxylic acid, 2,6-pyridine dicarboxylic acid, 2-pyridylacetic acid HCl, or 2-pyridineethanesulfonic acid, respectively. The removal rates for platinum or ruthenium were measured for each of the chemical-mechanical polishing systems at two different pH values (within ranges of 4.9-5.5 and 9-9.8). The removal rates for platinum and ruthenium for the chemical-mechanical polishing systems are summarized in Table 8.

TABLE 8

Platinum and Ruthenium Removal Rates for Various Polishing Additives

| Polishing Composition | Polishing Additive | pH | Pt RR (Å/min) | Ru RR (Å/min) |
|---|---|---|---|---|
| 5A (comparative) | cyclobutane dicarboxylic acid | 4.9 | 454 | 424 |
| | | 9.4 | 632 | 576 |
| 5B (invention) | 2-pyridine carboxaldehyde | 5.1 | 749 | 293 |
| | | 9.5 | 601 | 378 |
| 5C (invention) | 2-pyridinemethanol | 5.5 | 546 | 247 |
| | | 9.5 | 489 | 496 |
| 5D (invention) | 2,3-pyridinedicarboxylic acid | 5 | 566 | 335 |
| | | 9.5 | 530 | 414 |
| 5E (invention) | 2,6-pyridinedicarboxylic acid | 5 | 663 | 413 |
| | | 9.2 | 324 | 594 |
| 5F (invention) | 2-pyridylacetic acid HCl | 5.1 | 1043 | 216 |
| | | 9.8 | 511 | 531 |
| 5G (invention) | 2-pyridineethanesulfonic acid | 5.0 | 1077 | 200 |
| | | 9.7 | 463 | 270 |

These results demonstrate that high noble metal removal rates can be obtained using a chemical-mechanical polishing composition comprising a heterocyclic nitrogen-containing compound as a polishing additive.

EXAMPLE 6

This example compares the effect of polishing compositions comprising heterocyclic nitrogen-containing compounds with a polishing composition comprising no polishing additive on the rate of platinum or ruthenium removal.

Similar substrates comprising platinum or ruthenium, silica, and titanium layers were polished on a tabletop polisher with different polishing compositions (Polishing Compositions 6A-6F). Each of the polishing compositions contained 4 percent by weight alumina (60% α-alumina, 40% fumed alumina) and 1 percent by weight hydrogen peroxide. Polishing Compositions 6A and 6F (control) contained no polishing additive, and no oxidant. Polishing Compositions 6B and 6G (control) contained no polishing additive, and 1 percent by weight hydrogen peroxide. Polishing Compositions 6C, 6D, and 6E (invention) each contained 1 percent by weight of either 2-pyridylacetic acid HCl (without and with oxidant) or picolinic acid, respectively. Polishing Compositions 6H, 6I, and 6J (invention) each contained 6 percent by weight alumina (60% α-alumina, 40% fumed alumina) and 1 percent by weight of either 4-pyridineethanesulfonic acid (without and with oxidant) or 2-pyridylacetic acid HCl, respectively. The removal rates for ruthenium were measured for each of the chemical-mechanical polishing systems at a pH of 9.5. The removal rates for platinum were measured for each of the chemical-mechanical polishing systems at a pH of 2. The removal rates for ruthenium and platinum for the chemical-mechanical polishing systems are summarized in Tables 9 and 10.

TABLE 9

Ruthenium Removal Rates for Various Polishing Additives

| Polishing Composition | Polishing Additive | Abrasive | Oxidant | pH | Ru RR (Å/min) | $SiO_2$ RR (Å/min) | Ti RR (Å/min) |
|---|---|---|---|---|---|---|---|
| 6A (control) | none | 4 percent by weight alumina | None | 9.5 | 87 | 1423 | 1327 |
| 6B (control) | none | 4 percent by weight alumina | 1 percent by weight $H_2O_2$ | 9.5 | 960 | 1172 | 1988 |
| 6C (invention) | 1 percent by weight 2-pyridylacetic acid HCl | 4 percent by weight alumina | None | 9.5 | 38 | 1054 | 1309 |
| 6D (invention) | 1 percent by weight 2-pyridylacetic acid HCl | 4 percent by weight alumina | 1 percent by weight $H_2O_2$ | 9.5 | 1119 | 809 | 1896 |
| 6E (invention) | 1 percent by weight picolinic acid | 4 percent by weight alumina | 1 percent by weight $H_2O_2$ | 9.5 | 1028 | 567 | 1263 |

TABLE 10

Platinum Removal Rates for Various Polishing Additives

| Polishing Composition | Polishing Additive | Abrasive | Oxidant | pH | Pt RR (Å/min) | $SiO_2$ RR (Å/min) | Ti RR (Å/min) |
|---|---|---|---|---|---|---|---|
| 6F (control) | none | 6 percent by weight alumina | None | 2 | 2098 | 89 | 442 |
| 6G (control) | none | 6 percent by weight alumina | 1 percent by weight $H_2O_2$ | 2 | 1961 | 94 | 2163 |
| 6H (invention) | 1 percent by weight 4-pyridineethane sulfonic acid | 6 percent by weight alumina | None | 2 | >5000 | 79 | 597 |
| 6I (invention) | 1 percent by weight 4-pyridineethane sulfonic acid | 6 percent by weight alumina | 1 percent by weight $H_2O_2$ | 2 | >5000 | 92 | 1392 |
| 6J (invention) | 1 percent by weight 2-pyridylacetic acid HCl | 6 percent by weight alumina | 1 percent by weight $H_2O_2$ | 2 | 3000 | 104 | 966 |

These results demonstrate that high noble metal removal rates can be obtained using a chemical-mechanical polishing composition comprising a heterocyclic nitrogen-containing compound as a polishing additive.

EXAMPLE 7

This example compares the effect of polishing compositions comprising metal compounds and salts with a polishing composition comprising no polishing additive on the rate of platinum and ruthenium removal.

Similar substrates comprising platinum or ruthenium layers were polished on a tabletop polisher with different polishing compositions (Polishing Compositions 7A-7F). Each of the polishing compositions contained 5 percent by weight alumina (60% α-alumina, 40% fumed alumina) and 1 percent by weight hydrogen peroxide. Polishing Composition 7A (control) contained no iron salts or polishing additive. Polishing Compositions 7B, 7C, 7D, 7E, and 7F (invention) each contained 0.01 percent by weight of Fe(III) nitrate, 0.01 percent by weight Fe(II) sulfate, 100 ppm Mn(II) perchlorate, 100 ppm Cu(II) nitrate, and 100 ppm Ce(IV) oxide, respectively. The removal rates for platinum or ruthenium were measured for each of the chemical-mechanical polishing systems at pH 2, 5, and/or 9.5. The removal rates for platinum and ruthenium for the chemical-mechanical polishing systems are summarized in Table 11.

TABLE 11

Platinum and Ruthenium Removal Rates for Various Iron Compounds

| Polishing Composition | Polishing Additive | Oxidizer | pH | Pt RR (Å/min) | Ru RR (Å/min) |
|---|---|---|---|---|---|
| 7A (control) | none | $H_2O_2$ | 5 | 1186 | 150 |
|  |  |  | 9.5 | 1036 | 262 |
| 7B (invention) | Fe(III) nitrate | $H_2O_2$ | 5 | 1614 | 258 |
|  |  |  | 9.5 | 677 | 331 |
| 7C (invention) | Fe(II) sulfate | $H_2O_2$ | 5 | 1451 | 221 |
|  |  |  | 9.5 | 656 | 546 |
| 7D (invention) | Mn(II) perchlorate | $H_2O_2$ | 2 | 938 | — |
|  |  |  | 5 | 598 | 353 |
|  |  |  | 9.5 | 1101 | 544 |
| 7E (invention) | Cu(II) nitrate | $H_2O_2$ | 2 | 881 | — |
|  |  |  | 5 | 266 | 469 |
|  |  |  | 9.5 | 898 | 508 |
| 7F (invention) | Ce(IV) oxide | $H_2O_2$ | 5 | — | 428 |

These results demonstrate that high noble metal removal rates can be obtained using a chemical-mechanical polishing composition comprising a metal compound or salt in conjunction with a peroxy-type oxidizer.

EXAMPLE 8

This example compares the effect of polishing compositions comprising nitrogen-containing compounds that can be zwitterionic compounds on the rate of platinum or ruthenium removal.

Similar substrates comprising platinum, ruthenium, or oxide layers were polished on a tabletop polisher with different polishing compositions (Polishing Compositions 8A-8C). Each of the Polishing Compositions 8A-8C (invention) contained 8 percent by weight alumina (60% α-alumina, 40% fumed alumina), 1 percent by weight hydrogen peroxide, and 1 percent by weight of either 3-pyridinesulfonic acid, 1-(3-sulfopropyl)pyridinium hydroxide, or sulfanilic acid, respectively. The removal rates for platinum, ruthenium, and oxide for each of the chemical-mechanical polishing systems were determined, and the results are summarized in Table 12.

TABLE 12

Platinum and Ruthenium Removal Rates for Various Polishing Additives

| Polishing Composition | Polishing Additive | pH | Pt RR (Å/min) | Ru RR (Å/min) | Oxide RR (Å/min) |
|---|---|---|---|---|---|
| 8A (invention) | 3-pyridinesulfonic acid | 5.1 | 584 | 485 | 274 |
| 8B (invention) | 1-(-sulfopropyl)pyridinium hydroxide | 5 | 950 | 282 | 187 |
| 8C (invention) | sulfanilic acid | 5 | 636 | 395 | 160 |

These results demonstrate that high noble metal removal rates can be obtained using a chemical-mechanical polishing composition comprising a nitrogen-containing compound that can be a zwitterionic compound as a polishing additive.

EXAMPLE 9

This example compares the effect of polishing compositions comprising different ratios of α-alumina to fumed alumina on the rate of platinum or ruthenium removal.

Similar substrates comprising platinum, titanium, or oxide layers were polished on a tabletop polisher with different polishing compositions (Polishing Compositions 9A-9F). Each of the Polishing Compositions 9A and 9F (comparative) and 9B-9E (invention) contained 8 percent by weight alumina with 20%, 40%, 50%, 60%, 80%, and 100% α-alumina and 80%, 60%, 50%, 40%, 20% and 0% fumed alumina, respectively. The removal rates for platinum, titanium, and silicon dioxide for each of the chemical-mechanical polishing systems were determined, and the results are summarized in Table 13.

TABLE 13

Platinum, Titanium, and Oxide Removal Rates for Various Abrasive Mixtures

| Polishing Composition | % α-alumina | % fumed alumina | Pt RR (Å/min) | Ti RR (Å/min) | Oxide RR (Å/min) |
|---|---|---|---|---|---|
| 9A (comparative) | 20 | 80 | 884 | — | — |
| 9B (invention) | 40 | 60 | 1262 | 1155 | 55 |
| 9C (invention) | 50 | 50 | 1550 | — | — |
| 9D (invention) | 60 | 40 | 1649 | 1097 | 50 |
| 9E (invention) | 80 | 20 | 1640 | 1174 | 58 |
| 9F (comparative) | 100 | 0 | 354 | — | — |

These results demonstrate that high noble metal removal rates can be obtained using a chemical-mechanical polishing composition comprising about 40% to about 90% α-alumina and about 60% to about 10% fumed alumina, reflecting a weight ratio of α-alumina to fumed alumina of about 0.6:1 to about 4:1.

EXAMPLE 10

This example compares the effect of polishing compositions comprising sulfonic acid compounds on the rate of platinum removal.

Similar substrates comprising platinum were polished on an IPEC 472 polisher with different polishing compositions (Polishing Compositions 10A-10L). Each of the polishing compositions contained 3 percent by weight alumina (60% α-alumina, 40% fumed alumina) and had a pH of 3. Polishing Composition 10A (control) contained no polishing additive. Polishing Compositions 10B-10I (invention) contained about 4.4 mM hydroquinonesulfonic acid, 1-(3-sulfopropyl)pyridinium hydroxide, benzenesulfonic acid, 4-pyridineethanesulfonic acid, sulfanilic acid, N-tris(hydroxymethyl)methyl-2-aminoethanesulfonic acid, isethionic acid, and potassium trifluoromethanesulfonate, respectively. Polishing Compositions 10I-10L (comparative) contained potassium sulfate, 2,5-dihydroxybenzoic acid, and hydroquinone, respectively.

The removal rates (RR) and within-wafer-non-uniformity (WIWNU) of platinum were determined for each of the chemical-mechanical polishing systems, and the results are summarized in Table 14.

TABLE 14

Platinum Removal Rates for Sulfonic Acid Compounds

| Polishing Composition | Polishing Additive | RR (Å/min) | WIWNU (%) |
|---|---|---|---|
| 10A (control) | none | 631 | 34.8 |
| 10B (invention) | hydroquinone sulfonic acid | 2879 | 23.4 |
| 10C (invention) | 1-(3-sulfopropyl)pyridinium hydroxide | 3634 | 10.8 |
| 10D (invention) | benzenesulfonic acid | 3600 | 12.2 |
| 10E (invention) | 4-pyridineethanesulfonic acid | 2968 | 26.3 |
| 10F (invention) | sulfanilic acid | 2342 | 25.3 |
| 10G (invention) | N-tris(hydroxymethyl)methyl-2-aminoethane sulfonic acid | 950 | 22.3 |
| 10H (invention) | isethionic acid | 896 | 26.6 |
| 10I (invention) | potassium trifluoromethanesulfonate | 539 | 42.2 |
| 10J (comparative) | potassium sulfate | 498 | 15.9 |
| 10K (comparative) | 2,5-dihydroxybenzoic acid | 118 | 64.5 |
| 10L (comparative) | hydroquinone | 605 | 23.7 |

These results demonstrate that high noble metal removal rates can be obtained using a chemical-mechanical polishing composition comprising a sulfonic acid compound.

EXAMPLE 11

This example compares the effect of polishing compositions comprising sulfonic acid compounds with different abrasives on the rate of platinum removal.

Similar substrates comprising platinum were polished on an IPEC 472 polisher with different polishing compositions (Polishing Compositions 11A-11G). Polishing Compositions 11A and 11B each contained 1 percent by weight hydroquinonesulfonic acid (HQSA) and had a pH of 3. Polishing Compositions 11A contained 8 percent by weight fumed alumina. Polishing Composition 11B contained 8 percent by weight fumed silica. Polishing Compositions 11C-11G each contained 3 percent by weight alumina (60% α-alumina, 40% fumed alumina) and had a pH of 3. Polishing Compositions 1° C. and 11D contained α-alumina having a mean particle size of 100 nm, and contained 0 and 1 percent by weight hydroquinonesulfonic acid (HQSA), respectively. Polishing Compositions 11E-11G contained α-alumina having a mean particle size of 250 nm, and contained 0, 0.5, and 1 percent by weight hydroquinonesulfonic acid (HQSA), respectively.

The removal rates (RR) and within-wafer-non-uniformity (WIWNU) of platinum were determined for each of the chemical-mechanical polishing systems, and the results are summarized in Table 15.

TABLE 15

Platinum Removal Rates

| Polishing Composition | Abrasive | Mean Particle Size α-Alumina | Polishing Additive (wt. %) | RR (Å/min) | WIWNU (%) |
|---|---|---|---|---|---|
| 11A (invention) | 8 wt. % fumed alumina | N/A | 1 wt. % HQSA | 0 | N/A |
| 11B (invention) | 8 wt. % fumed silica | N/A | 1 wt. % HQSA | 0 | N/A |
| 11C (control) | 1.8 wt. % α-alumina 1.2 wt. % fumed alumina | 100 nm | 0 wt. % HQSA | 269 | 18.5 |
| 11D (invention) | 1.8 wt. % α-alumina 1.2 wt. % fumed alumina | 100 nm | 1 wt. % HQSA | 9 | 36.3 |
| 11E (control) | 1.8 wt. % α-alumina 1.2 wt. % fumed alumina | 250 nm | 0 wt. % HQSA | 631 | 34.8 |
| 11F (invention) | 1.8 wt. % α-alumina 1.2 wt. % fumed alumina | 250 nm | 0.5 wt. % HQSA | 1808 | 22.5 |
| 11G (invention) | 1.8 wt. % α-alumina 1.2 wt. % fumed alumina | 250 nm | 1 wt. % HQSA | 2984 | 21.6 |

These results demonstrate that high noble metal removal rates can be obtained using a chemical-mechanical polishing composition comprising α-alumina in combination with a sulfonic acid compound.

EXAMPLE 12

This example compares the effect of polishing compositions comprising sulfonic acid compounds with polishing compositions comprising phosphonic acid compounds on the rate of platinum removal.

Similar substrates comprising platinum were polished on an IPEC 472 polisher with different polishing compositions (Polishing Compositions 12A-12E). Polishing Compositions 12A-12E each contained 3 percent by weight alumina (60% α-alumina, 40% fumed alumina) and had a pH of 3. Polishing Compositions 12A (control) did not contain any polishing additives. Polishing Compositions 12B and 12C (invention) contained 1 percent by weight 5-formyl-2-furane sulfonic acid and 1-(3-sulfopropyl)pyridinium hydroxide respectively. Polishing Compositions 12D and 12E contained phenylphosphonic acid and 2-carboxyethylphosphonic acid, respectively.

The removal rates (RR) and within-wafer-non-uniformity (WIWNU) of platinum were determined for each of the chemical-mechanical polishing systems, and the results are summarized in Table 16.

TABLE 16

Platinum Removal Rates

| Polishing Composition | Polishing Additive | RR (Å/min) | WIWNU (%) |
|---|---|---|---|
| 12A (control) | none | 1101.4 | 14.8 |
| 12B (invention) | 5-formyl-2-furane sulfonic acid | 2141.7 | 26.0 |
| 12C (control) | 1-(3-sulfopropyl)pyridinium hydroxide | 2638.1 | 13.8 |
| 12D (comparative) | phenylphosphonic acid | 102.0 | 21.9 |
| 12E (comparative) | 2-carboxyethylphosphonic acid | 139.8 | 37.2 |

These results demonstrate that high noble metal removal rates can be obtained using a chemical-mechanical polishing composition comprising sulfonic acid compounds.

EXAMPLE 13

This example illustrates the effectiveness of tantalum CMP polishing compositions and methods of the invention comprising a variety of organic oxidizers in polishing tantalum blanket wafers. The tantalum CMP compositions comprised about 0.5% by weight of fumed silica abrasive, about 0.5% by weight of cesium carbonate and about 5 millimolar concentration of organic oxidizer in deionized water as the liquid carrier at a pH of about 10. Tantalum blanket wafers (about 4 inches in diameter with a 250 nm deposition thickness of tantalum) were polished on a Logitech Model CDP polisher using polyurethane IC polishing pad rotating at about 110 rpm, with the wafers mounted on a platen rotating at about 102 rpm, applying a down force of about 1.5 pounds per square inch. Each tantalum CMP composition was provided to the surface of the wafer at a feed rate of about 150 mL per minute. Organic oxidizers examined included 9,10-anthraquinone-2,6-disulfonic acid disodium salt (AQDSA), 9,10-anthraquinone-1,8-disulfonic acid disodium salt (1,8-AQDSA), 9,10-anthraquinone-2-sulfonic acid sodium salt (AQSA-Na), 1,2-naphthoquinone4-sulfonic acid potassium salt (NQSA-K), Alizarin, Alizarin Red S, Acid Blue 45, indigo-5,5'-disulfonic acid disodium salt (Indigo-DSA), and 2,5-dihydroxy-1,4-benzoquinone (2,5-DHBQ). Tantalum removal rates for polishing runs using the various CMP compositions are provided in Table 17.

TABLE 17

Tantalum removal rates for CMP compositions and methods of the invention

| Oxidizer | Tantalum Removal Rate (Å/min) |
|---|---|
| Potassium Iodate (control) | 309 |
| AQDSA | 620 |
| 1,8-AQDSA | 754 |
| NQSA-K | 717 |
| 2,5-DHBQ | 505 |
| AQSA-Na | 579 |
| Indigo-DSA | 679 |
| Alizarin | 698 |

TABLE 17-continued

Tantalum removal rates for CMP compositions and methods of the invention

| Oxidizer | Tantalum Removal Rate (Å/min) |
|---|---|
| Alizarin Red S | 610 |
| Acid Blue 45 | 409 |

The results in Table 17 show excellent tantalum removal rates for the tantalum CMP compositions of the invention in comparison with a control CMP composition having 5 millimolar potassium iodate in place of the organic oxidizer.

EXAMPLE 14

This example illustrates the effectiveness of tantalum CMP polishing compositions and methods of the invention comprising various organic oxidizers in combination with potassium iodate (5 millimolar) as an auxiliary oxidizing agent in polishing tantalum blanket wafers.

Tantalum CMP compositions containing organic oxidizers were utilized to polish tantalum blanket wafers as in Example 13. The base slurry compositions and polishing conditions were substantially as reported in Example 13, as well. In the slurries of this Example, the organic oxidizers were present in the slurry at a concentration of about 0.5 millimolar, in combination with 5 millimolar potassium iodate. Organic oxidizers that were evaluated included 9,10-anthraquinone-2,6-disulfonic acid disodium salt (AQDSA), 9,10-anthraquinone-1,8-disulfonic acid dipotassium salt (1,8-AQDSA-K), 9,10-anthraquinone-2-sulfonic acid sodium salt (AQSA-Na), Alizarin, Acid Blue 45, nicotinamide, indigo-5,5'-disulfonic acid disodium salt (Indigo-DSA), 2,5-dihydroxy-1,4-benzoquinone (2,5-DHBQ), and 2,6-dichloroindophenol sodium salt (2,6-DCI-Na) The percentage change in tantalum removal rates for polishing runs using the various CMP compositions of the invention compared to a slurry having potassium iodate as the sole oxidizing agent are provided in Table 18.

TABLE 18

Tantalum removal rates for CMP compositions and methods of the invention

| Oxidizer | % Change in Tantalum Removal Rate (Å/min) |
|---|---|
| AQSA-Na | +87% |
| AQDSA | +72% |
| 1,8-AQDSA-K | +71% |
| Indigo-DSA | +48% |
| Alizarin | +20% |
| Acid Blue 45 | +13% |
| DCI-Na | +13% |
| Nicotinamide | No change |
| 2,5-DHBQ | No change |

The results in Table 18 indicate that, in most cases, presence of as little as 0.5 millimolar organic oxidizer in combination with 5 millimolar potassium iodate provided a significant improvement in tantalum removal rate compared to 5 millimolar potassium iodate alone. 2,5-DHBQ, while not effective at the 0.5 millimolar level in these tests, is effective at higher concentrations in combination with iodate and is very effective when used as the sole oxidizing agent at a 5 millimolar concentration, as shown in Example 13.

EXAMPLE 15

This example illustrates the effectiveness of tantalum CMP polishing compositions and methods of the invention to selectively oxidize tantalum in the presence of copper, compared to inorganic oxidizing agents.

Tantalum CMP compositions of the invention were utilized to polish tantalum blanket wafers and copper wafers using the same type of polishing pad and under the substantially the same polishing pad and platen rotation rates and down-pressure as in Examples 13 and 14. The CMP compositions for this Example were prepared at a pH of about 2.2, with 0.5% by weight of fumed silica as the abrasive, in deionized water as the liquid carrier. All oxidizers (organic and inorganic) were utilized at a concentration of about 2 millimolar. Organic oxidizers that were evaluated included 9,10-anthraquinone-1,5-disulfonic acid disodium salt (1,5-AQDSA) and 9,10-anthraquinone-1,8-disulfonic acid dipotassium salt (1,8-AQDSA-K). Control test were run using hydrogen peroxide ($H_2O_2$), ferric nitrate ($Fe(NO_3)_3$), potassium iodate ($KIO_3$), potassium persulfate ($K_2S_2O_8$), and without any oxidizer, as well. The tantalum removal rates, copper removal rates, and the ratio of tantalum removal rate-to-copper removal rate (Ta/Cu selectivity) are provided in Table 19.

TABLE 19

Tantalum/copper removal selectivity using CMP compositions and methods of the invention

| Oxidizer | Ta RR (Å/min) | Cu RR (Å/min) | Ta RR/Cu RR |
|---|---|---|---|
| 1,8-AQDSA-K | 262 | 101 | 2.59 |
| 1,5-AQDSA | 202 | 151 | 1.34 |
| $H_2O_2$ | 67 | 405 | 0.17 |
| $Fe(NO_3)_3$ | 3 | 963 | 0.00 |
| $KIO_3$ | 418 | 2613 | 0.16 |
| $K_2S_2O_8$ | 252 | 271 | 0.93 |
| No Oxidizer | 0 | 210 | 0.00 |

The results in Table 19 indicate that the CMP compositions of the invention, comprising organic oxidizers, preferentially remove the tantalum relative to copper, in contrast to conventional inorganic oxidizing agents, which preferentially removed copper relative to tantalum.

EXAMPLE 16

This example further illustrates the effectiveness of the tantalum CMP polishing compositions and methods of the invention utilizing a CMP composition comprising an organic oxidizer to polish a tantalum-containing surface.

Tantalum blanket wafers of about 4 inches in diameter having a 250 nm tantalum deposition thickness were polished on a Logitech Model CDP polisher using polyurethane IC polishing pad rotating at about 110 rpm, with the wafers mounted on a platen rotating at about 102 rpm, applying a down force of about 1.5 pounds per square inch. Each tantalum CMP composition was provided to the surface of the wafer at a feed rate of about 150 mL per minute. Each slurry was prepared with about 1 percent by weight colloidal silica at a pH pf about 2.2 with a concentration of organic oxidizer of about 2 millimolar, in deionized water as the liquid carrier. Organic oxidizers having $E^o$ values from about 0.1 to about 0.67 relative to SHE were evaluated. The organic oxidizers, $E^o$ values and tantalum removal rates are listed in Table 20.

TABLE 20

Tantalum removal rates for CMP compositions and methods of the invention

| Oxidizer | Approximate $E^o$ (V vs. SHE) | Ta RR (Å/min) |
|---|---|---|
| 9,10-anthraquinone-1,8-disulfonate | +0.10 | 458 |
| 9,10-anthraquinone-2,6-disulfonate | +0.23 | 389 |
| 2,5-dihydroxy-1,4-benzoquinone | +0.50 | 501 |
| 1,2-naphthoquinone-4-sulfonate | +0.56 | 477 |
| 2,6-dichloroindophenol | +0.67 | 514 |

The data in Table 20 show that CMP compositions containing an organic oxidizer having an $E^o$ values between 0.1 V and 0.67 V relative to SHE, and a colloidal silica abrasive, provided very effective tantalum removal rates ranging from about 389 to about 514 Å/min.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical mechanical polishing (CMP) composition suitable for use in a tantalum CMP process, which comprises:
    (a) an abrasive;
    (b) an organic oxidizer having a standard redox potential ($E^o$) of not more than about 0.5 V relative to a standard hydrogen electrode, the organic oxidizer comprising at least one pi-conjugated ring, the ring including at least one heteroatom directly attached thereto, the at least one heteroatom being selected from the group consisting of N, O, S, and a combination thereof; wherein the organic oxidizer compound is selected from the group consisting of: a compound having at least one quinone moiety, a paraphenylenediamine compound, a phenazine compound, a thionine compound, a phenoxazine compound, phenoxathiin compound, an indigo compound, an indophenol compound, and a combination thereof; and (c) a liquid carrier therefor.

2. The composition of claim 1 wherein the organic oxidizer comprises an unsaturated hydrocarbon ring, an unsaturated heterocyclic ring, or a combination thereof.

3. The composition of claim 2 wherein the heterocylic ring includes 2 or more heteroatoms selected from the group consisting of N, O, S, and a combination thereof.

4. The composition in claim 1 wherein the at least one heteroatom comprises at least three heteroatoms selected from the group consisting of N, O, S, and a combination thereof.

5. The composition of claim 1 wherein the organic oxidizer is capable of undergoing a reversible redox reaction, as characterized by a cyclic voltamogram in which both an anodic and cathodic reaction are observable.

6. The composition of claim 1 wherein the organic oxidizer includes at least one acidic substituent or a salt thereof.

7. The composition of claim 6 wherein the at least one acidic substituent is selected from the group consisting of carboxylic acid substituent, a sulfonic acid substituent, a phosphonic acid substituent, a salt thereof, and a combination thereof.

8. The composition of claim 1 wherein the organic oxidizer is present in the liquid carrier at a concentration of mediator compound in the range of about 0.1 to about 10 millimolar.

9. The composition of claim 1 wherein the organic oxidizer includes at least one quinone moiety.

10. The composition of claim 9 wherein the organic oxidizer compound comprises an anthraquinone compound.

11. The composition of claim 10 wherein the anthraquinone compound is selected from the group consisting of 9,10-anthraquinone-2,6-disulfonic acid, 9,10-anthraquinone-2,7-disulfonic acid, 9,10-anthraquinone-2-sulfonic acid, 9,10-anthraquinone-1,8-disulfonic acid, 9,10-anthraquinone-1,5-disulfonic acid, Alizarin, Alizarin Red S, Acid Blue 45, a salt thereof and a combination thereof.

12. The composition of claim 9 wherein the organic oxidizer comprises a benzoquinone compound.

13. The composition of claim 12 wherein the benzoquinone compound is 2,5-dihydroxy-1,4-benzophenone or a salt thereof.

14. The composition of claim 9 wherein the organic oxidizer is a naphthoquinone compound.

15. The composition of claim 1 wherein the oxidized form of the organic oxidizer is a cationic compound.

16. The composition of claim 1 further comprising an auxiliary oxidizing agent.

17. The composition of claim 16 wherein the auxiliary oxidizing agent comprises at least one oxidizer selected from the group consisting of a periodate compound, a persulfate compound, and hydrogen peroxide.

18. The composition of claim 1 wherein the abrasive is suspended in the liquid carrier at a total solids content in the range of about 0.01 to about 5 percent on a weight basis.

19. The composition of claim 1 wherein the abrasive is selected from the group consisting of a silica abrasive, an alumina abrasive, a zirconia abrasive, a ceria abrasive, and a combination thereof.

20. The composition of claim 1 wherein the abrasive comprises colloidal silica.

21. The composition of claim 1 wherein the organic oxidizer is the sole oxidizing agent present in the composition.

22. The composition of claim 1 wherein the organic oxidizer is capable of selectively oxidizing tantalum in the presence of copper.

23. A method for chemical mechanical polishing (CMP) comprising abrading a tantalum-containing surface of a substrate with a CMP composition, the CMP composition comprising:

(a) an organic oxidizer having a standard redox potential ($E^0$) of not more than about 0.5 V relative to a standard hydrogen electrode, the organic oxidizer comprising at least one pi-conjugated ring, the ring including at least one heteroatom attached directly thereto, the at least one heteroatom being selected from the group consisting of N, O, S and a combination thereof; wherein the organic oxidizer includes at least one quinone moiety; and (b) a liquid carrier therefor.

24. The method of claim 23 wherein the surface comprises, at least in part, tantalum, tantalum nitride, or a combination thereof.

25. The method of claim 23 wherein the surface further comprises copper.

26. The method of claim 23 wherein the organic oxidizer is a compound selected from the group consisting of an anthraquinone compound, a naphthoquinone compound, a benzoquinone compound, and a combination thereof.

27. The method of claim 26 wherein the anthraquinone compound is selected from the group consisting of 9,10-anthraquinone-2,6-disulfonic acid, 9,10-anthraquinone-2,7-disulfonic acid, 9,10-anthraquinone-2-sulfonic acid, 9,10-anthraquinone-1,8-disulfonic acid, 9,10-anthraquinone-1,5-disulfonic acid, Alizarin, Alizarin Red S, Acid Blue 45, a salt thereof, and a combination thereof.

28. The method of claim 26 wherein the benzoquinone compound is 2,5-dihydroxy-1,4-benzoquinone or a salt thereof.

29. The meted of claim 23 wherein the organic oxidizer is the sole oxidizing agent present in the CMP composition.

30. The method of claim 23 wherein the CMP composition further comprises an abrasive material.

31. A method for chemical mechanical polishing (CMP) comprising abrading a tantalum-containing surface of a substrate with a CMP composition, the CMP composition comprising:

(a) an organic oxidizer having a standard redox potential ($E^0$) of not more than about 0.7 V relative to a standard hydrogen electrode, the organic oxidizer comprising at least one pi-conjugated ring, the ring including at least one heteroatom attached directly thereto, the at least one heteroatom being selected from the group consisting of N, O, S and a combination thereof; wherein the organic oxidizer includes at least one quinone moiety; and (b) a liquid carrier therefor.

32. The method of claim 31 wherein the surface of the substrate comprises, at least in part, tantalum, tantalum nitride, or a combination thereof.

33. The method of claim 31 wherein the surface further comprises copper.

34. The method of claim 31 wherein the organic oxidizer is a compound selected from the group consisting of an anthraquinone compound, a naphthoquinone compound, a benzoquinone compound, and a combination thereof.

35. The method of claim 34 wherein the anthraquinone compound is selected from the group consisting of 9,10-anthraquinone-2,6-disulfonic acid, 9,10-anthraquinone-2,7-disulfonic acid, 9,10-anthraquinone-2-sulfonic acid, 9,10-anthraquinone-1,8-disulfonic acid, 9,10-anthraquinone-1,5-disulfonic acid, Alizarin, Alizarin Red S, Acid Blue 45, a salt thereof, and a combination thereof.

36. The method of claim 34 wherein the naphthoquinone compound is 1,2-naphthoquinone-4-sulfonic acid, and a salt thereof.

37. The method of claim 34 wherein the benzoquinone compound is 2,5-dihydroxy-1,4-benzoquinone or a salt thereof.

38. The method of claim 31 wherein the organic oxidizer is the sole oxidizing agent present in the method composition.

39. The method of claim 31 wherein the CMP composition further comprises an abrasive material.

* * * * *